US008278725B2

(12) United States Patent
Tripathy et al.

(10) Patent No.: US 8,278,725 B2
(45) Date of Patent: Oct. 2, 2012

(54) MICROMECHANICAL STRUCTURE AND A METHOD OF FABRICATING A MICROMECHANICAL STRUCTURE

(75) Inventors: Sudhiranjan Tripathy, Singapore (SG); Vicknesh s/o Sahmuganathan, Singapore (SG)

(73) Assignee: Agency for Science, Technology and Research, Connexis (SG)

( * ) Notice: Subject to any disclaimer, the term of this patent is extended or adjusted under 35 U.S.C. 154(b) by 135 days.

(21) Appl. No.: 12/514,304

(22) PCT Filed: Nov. 9, 2007

(86) PCT No.: PCT/SG2007/000386
§ 371 (c)(1),
(2), (4) Date: Mar. 30, 2010

(87) PCT Pub. No.: WO2008/057055
PCT Pub. Date: May 15, 2008

(65) Prior Publication Data
US 2010/0193781 A1    Aug. 5, 2010

Related U.S. Application Data

(60) Provisional application No. 60/858,076, filed on Nov. 10, 2006.

(51) Int. Cl.
*H01L 21/00* (2006.01)
*H01L 29/04* (2006.01)
(52) U.S. Cl. ..... 257/414; 257/76; 257/77; 257/E29.324; 438/50
(58) Field of Classification Search .......... 257/47, 257/76, 77, E29.094, E29.082, E29.089, 257/E21.09, 414, E29.324; 438/479, 50, 438/52; 977/720, 723
See application file for complete search history.

(56) References Cited

U.S. PATENT DOCUMENTS

| 6,290,864 | B1 | 9/2001 | Patel et al. |
| 6,884,740 | B2 | 4/2005 | Hu et al. |
| 6,942,811 | B2 | 9/2005 | Patel et al. |
| 6,960,305 | B2 | 11/2005 | Doan et al. |
| 7,027,200 | B2 | 4/2006 | Shi et al. |
| 7,027,202 | B1 | 4/2006 | Hunter et al. |
| 7,041,224 | B2 | 5/2006 | Patel et al. |
| 2002/0067992 | A1 | 6/2002 | Bridger et al. |

(Continued)

FOREIGN PATENT DOCUMENTS
WO   WO-2006/101762 A1   9/2006
(Continued)

OTHER PUBLICATIONS

Strittmatter, R. P. et al. (May 21, 2001). "Fabrication of GaN suspended microstructures," *Applied Physics Letters* 78(21):3226-3228.

(Continued)

*Primary Examiner* — Victor A Mandala
*Assistant Examiner* — Selim Ahmed
(74) *Attorney, Agent, or Firm* — Morrision & Foerster LLP

(57) ABSTRACT

A micromechanical structure and a method of fabricating a micromechanical structure are provided. The micromechanical structure comprises a silicon (Si) based substrate; a micromechanical element formed directly on the substrate; and an undercut formed underneath a released portion of the micromechanical element; wherein the undercut is in the form of a recess formed in the Si based substrate.

15 Claims, 21 Drawing Sheets

U.S. PATENT DOCUMENTS

| | | | |
|---|---|---|---|
| 2003/0045120 A1* | 3/2003 | Hu et al. | 438/745 |
| 2003/0119220 A1* | 6/2003 | Mlcak et al. | 438/52 |
| 2003/0143775 A1 | 7/2003 | Brady | |
| 2003/0193269 A1* | 10/2003 | Jang et al. | 310/346 |
| 2005/0019974 A1* | 1/2005 | Lutz et al. | 438/52 |
| 2005/0098840 A1* | 5/2005 | Fuertsch et al. | 257/414 |
| 2006/0160262 A1 | 7/2006 | Cheung et al. | |
| 2006/0160345 A1* | 7/2006 | Liu et al. | 438/604 |
| 2006/0223291 A1 | 10/2006 | Chen et al. | |

FOREIGN PATENT DOCUMENTS

| | | | |
|---|---|---|---|
| WO | WO-2008/057055 A1 | 5/2008 | |

OTHER PUBLICATIONS

Toda, R. et al. (Jun. 1997). "Thin beam bulk micromachining based on RIE and Xenon Difluoride Silicon Etching," *International Conference on Solid-state Sensors and Actuators*, Chicago, 671-674.

Tripathy, S. et al. (2007). "Micro-Raman probing of residual stress in freestanding GaN-based micromechanical structures fabricated by a dry release technique," *Journal of Applied Physics* 101:063525.1-063525.4.

Vicknesh, S. et al. (2007). "Surface micromachined freestanding ZnO microbridge and cantilever structures on Si(111) substrates," *Applied Physics Letters* 90:091913.1-091913.3.

Wang, L. S. (Dec. 13, 2004). "Effects of periodic delta-doping on the properties of GaN:Si films grown on Si (111) substrates," *Applied Physics Letters* 85(24):5881-5883.

Wang, L. S. et al. (2005). "InGaN/GaN multi-quantum-well structures on (111)-oriented bonded silicon-on-insulator substrates," *Applied Physics Letters* 87:111908.1-111908.3.

Watanabe, A. et al. (1993). "The growth of single crystalline GaN on a Si substrate using AlN as an intermediate layer," *Journal of Crystal Growth* 128:391-396.

Winters, H. F. and Coburn, J. W. (Jan. 1, 1979). "The etching of silicon with XeF2 vapor," *Applied Physics Letters* 34(1):70-73.

Yang, Z. et al. (2006). "GaN-on-patternedsilicon (GPS) technique for fabrication of GaN-based MEMS," *Sensors and Actuators A*, Accepted for Publication (Inpress), 8 pages.

Yang, Z. et al. (2006). "Mechanical characterization of suspended GaN .microstructures fabricated by GaN-onpatterned-silicon technique," *Applied Physics Letters* 88:041913.1-041913.3.

Yang, Z. et al. (Mar./Apr. 1995). "Approach to obtain high quality GaN on Si and SiC-on-silicon-on-insulator compliant substrate by molecularbeam epitaxy," *Applied Physics* 13(2):789-791.

Zhou, S. Q. et al. (2005). "Comparison of the properties of GaN grown on complex Si-based structures," *Applied Physics Letters* 86:081912.1-081912.3.

Zubia, D. et al. (Feb. 14, 2000). "Nanoheteroepitaxial growth of GaN on Si by organometallic vapor phase epitaxy," *Applied Physics Letters* 76(7):7858-860.

Alley, R. L. et al. (1992). "The Effect of Release-Etch Processing on Surface Microstructure Stiction," *Solid-state Sensors and Actuator Workshop*, Hilton Head, SC, pp. 202-207.

Armitage, R. et al. (Aug. 19, 2002). "Lattice-matched HfN buffer layers for epitaxy of GaN on Sin," *Applied Physics Letters* 81(8):1450-1452.

Auret, F. D. et al. (Nov. 5, 2001). "Electrical characterization of 1.8 MeV proton-bombarded ZnO," *Applied Physics Letters* 79(19):3074-3076.

Bardwell, J. A. et al. (Mar. 20, 2003). "AlGaN-GaN HFET devices on SiC grown by ammonia-MBE with high fT and fMAX," *Electronics Letters* 39(6):564-566.

Bourland, S. et al. (Sep./Oct. 2001). "Silicon-on-insulator processes for the fabrication of novel nanostructures," *Journal of Vacuum Science and Technology B* 19(5):1995-1997.

Bruel, M. (Jul. 6, 1995). "Silicon on insulator material technology," *Electronics Letters* 31(14):1201-1202.

Bruel, M. et al. (Mar. 1997). "Smart-Cut: A New Silicon on Insulator Material Technology Based on Hydrogen Implantation and Wafer Bonding," *Japanese Journal of Applied Physics* 36(3B):1636-1641.

Cao, J. et al. (Dec. 29, 1997). "Photoluminescence properties of GaN grown on compliant silicon-an-insulator substrates," *Applied Physics Letters* 71(26):3880-3882.

Chan, I. W. T. et al. (May 1999). "Gas phase pulse etching of silicon for MEMS with Xenon Difluoride," *IEEE Canadian Conference on Electrical and Computer Engineering*, pp. 1637-1642.

Chu, P. B. et al. (Jun. 1997). "Controlled pulse-etching with Xenon Difluoride," *International Conference on Solid-state Sensors and Actuators*, Chicago, pp. 665-668.

Crisler, D. F. et al. (Feb. 1968). "Dielectric, Piezoelectric, and Electromechanical Coupling Constants of Zinc Oxide Crystals," *Proceedings of the IEEE* 56:225-226.

Davies, S. et al. (2004). "Fabrication of epitaxial III-nitride cantilevers on silicon (111) substrates," *Journal of Materials Science*, 15:705-710.

Davies, S. et al. (Apr. 5, 2004). "Fabrication of GaN cantilevers on silicon substrates for microelectromechanical devices," *Applied Physics Letters* 84(14):2556-2568.

Gaska, R. et al. (Mar. 1, 1999). "Two-channel AlGaN-GaN heterostructure field effect transistor for high power applications," *Journal of Applied Physics* 85(5):3009-3011.

Guckel, H. et al. (Feb. 1989). "Advances in processing techniques for silicon micromechanical devices with smooth surfaces," *Proceedings IEEE Micro Electro Mechanical Systems*, Salt Lake City, Utah, pp. 71-75.

Heikman, S. et al. (Oct. 15, 2003). "High Conductivity Modulation Doped AlGaN-GaN Multiple Channel Heterostructures," *Journal of Applied Physics* 94(8):5321-5325.

Hiramatsu, K. et al. (1991). "Growth mechanism of GaN grown on sapphire with A1N buffer layer by Movpe," *Journal of Applied Physics Letters* 115:628-633.

Hoffman, E. et al. (1995). "3D structures with piezoresistive sensors in standard CMOS," *Proceedings of Micro ElectroMechanical Systems Workshop*, pp. 288-293.

Holland, O. W. et al. (Jul. 29, 1996). "Formation of ultrathin, buried oxides in Si by 0+ ion implantation," *Applied Physics Letters* 69(5):674-676.

Ibbotson, D. E. et al. (Jun. 15, 1984). "Comparison of XeF2 and F-atom reactions with Si and SiO2," *Applied Physics Letters* 44(12):1129-1131.

Akasaki, I. et al. (1989). "Effects of ain buffer layer on crystallographic structures and on electrical and optical properties of GaN and $Ga_{1-x}Al_xN$ (0<x 0.4) films grown on sapphire substrate by Movpe" *Journal of Applied Physics Letters* 98:209-219.

Ishikawa, H. et al. (1999). "GaN on Si Substrate with AlGaN-AlN Intermediate Layer," *Japanese Journal of Applied Physics* 38(5A):L492-L494.

Jimenez, A. et al. (Jun. 30, 2003). "Improved AlGaN-GaN high electron mobility transistor using AlN interlayers," *Applied Physics Letters* 82(26):4827-4829.

Kang, B. S. et al. (Oct. 4, 2004). "Pressure-induced changes in the conductivity of AlGaN/GaN high-electron mobility-transistor membranes," *Applied Physics Letters* 85(14):2962-2964.

Kim, C.-J. et al. (1998). "Comparative evaluation of drying techniques for surface micromachining," *Sensors and Actuators A* 64:17-26.

Krost, A. et al. (Oct. 18, 2004). "Evolution of stress in GaN heteroepitaxy on AlN/Si(111): From hydrostatic compressive to biaxial tensile," *Applied Physics Letters* 85(16):3441-3443.

Lebedev, A. A. et al. (2002). "Radiation Hardness of Wide-Gap Semiconductors (using the Example of Silicon Carbide)," *Semiconductors* 36(11):1270-1275.

Lee, S. C. et al. (2004). "Phase control of GaN on Si by nanoscale faceting in metalorganic vapor-phase epitaxy," *Applied Physics* 272:2-8.

Lee, S. C. et al. (Mar. 22, 2004). "Spatial phase separation of GaN selectively grown on a nanoscale faceted Si surface," *Applied Physics Letters* 84(12):2079-2081.

Lei, T. et al. (Aug. 19, 1991). "Epitaxial growth of zinc blende and wurtzitic gallium nitride thin films on (001) silicon," *Applied Physics Letters* 59(8):944-946.

Look, D. C. et al. (Aug. 9, 1999). "Production and annealing of electron irradiation damage in ZnO," *Applied Physics Letters* 75(6):811-813.

Mileham, J. R. et al. (May/Jun. 1996). "Patterning of AlN, InN, and GaN in KOH-based solutions," *Journal of Vacuum Science and Technology A* 14(3):836-839.

Mukai, T. and Nakamura, S. (Oct. 1999). "Ultraviolet InGaN Single-Quantum-Well-Structure Light-Emitting Diodes Grown on Epitaxially Laterally Overgrown GaN Substrates," *Japanese Journal of Applied Physics* 38(10):5735-5739.

Nakamura, S., Senoh, M., Iwasa, N., and Nagahama, S. (Sep. 25, 1995). "High-power InGaN single-quantum-well-structure blue and violet light-emitting diodes," *Applied Physics Letters* 67(13):1868-1870.

Nam, O.-H. et al. (Nov. 3, 1997). "Lateral epitaxy of low defect density GaN layers via organometallic vapor phase epitaxy," *Applied Physics Letters* 71(18):2638-2640.

Neuberger, M. et al. (2004). "GaN Based Piezo Sensors," *Device research conference*, Notre Dame, USA, pp. 45.

Ozgur, U. et al. (2005). "A comprehensive review of 2nO materials and devices," *Journal of Applied Physics Letters* 98:041301.1-040301.103.

Pearton, S. J. et al. (2004). "GaN-based diodes and transistors for chemical, gas, biological and pressure sensing," *Journal of Physics: Condensed Matter* 16:R961-R994.

Pernot, C. et al. (2000). "Solar-Blind UV Photodetectors Based on GaN/AlGaN p-i-n Photodiodes," *Japanese Journal of Applied Physics* 39(5A):L387-L389.

Powell, R. C. et al. (Jan. 1, 1993). "Heteroepitaxial wurtzite and zincblende structure GaN grown by reactive-ion molecular-beam epitaxy: Growth kinetics, microstructure, and properties," *Journal of Applied Physics* 73(1):189-204.

Shah, M. A. et al. (2005). "Fabrication of Freestanding GaN Micromechanical Structures on Silicon-on-Insulator Substrates," *Electrochemical and Solid-State Letters* 8(10):G275-G279.

Siedel, H. et al. (Nov. 1990). "Anisotropic Etching of Crystalline Silicon in Alkaline Solutions .1. Orientation Dependence and Behavior of Passivation Layers," *Journal of the Electrochemical Society* 137(11):3612-3626.

Stonas, A R. et al. (Nov./Dec. 2001). "Photoelectrochemical undercut etching for fabrication of GaN microelectromechanical systems," *Journal of Vacuum Science and Technology B* 19(6):2838-2841.

Stonas, A R. et al. (Oct. 16, 2000). "Backside-Illuminated Photoelectrochemical Etching for the Fabrication of Deeply Undercut GaN Structures," *Applied Physics Letters* 77(16):2610-2612.

\* cited by examiner (a)

(b)

(a)

(b)

(c)

InGaN/GaN LED membrane and FET cantilevers on bulk Si(111)

(a)　　　　　　　　　　　　(b)

InGaN/GaN LED membrane and FET cantilevers on SOI(111)

(c)　　　　　　　　　　　　(d)

Optical microscopic and SEM images of undercut microdisk LEDs (a)                                          (b)

(c)

MICROMECHANICAL STRUCTURE AND A METHOD OF FABRICATING A MICROMECHANICAL STRUCTURE

CROSS REFERENCE TO RELATED APPLICATIONS

This is a U.S. National Phase patent application of PCT/SG2007/000386, filed Nov. 9, 2007, which claims priority to U.S. provisional patent application Ser. No. 60/858,076, filed Nov. 10, 2006, all of which are hereby incorporated by reference in the present disclosure in their entirety.

FIELD OF INVENTION

The present invention relates broadly to a micromechanical structure and to a method of fabricating a micromechanical structure.

BACKGROUND

In current semiconductor manufacturing technology, wide bandgap materials are typically used in optoelectronic and microelectronic devices. One such material is Gallium Nitride (GaN). GaN typically has properties such as a wide bandgap (e.g. $E_g$ ~3.4 eV at 300K), a large elastic modulus, high piezoelectric and piezoresistive coefficients and chemical inertness. Thus, GaN is a suitable material for microelectromechanical systems (MEMS) applications, more particularly in harsh conditions such as conditions requiring high-temperature piezoelectrics and high breakdown voltages etc.

Typically, due to the lack of GaN single crystals, GaN heteroepitaxial layers for optoelectronics and microelectronics device applications are grown on "foreign" substrates such as on sapphire ($\alpha$-$Al_2O_3$) substrates having about 16% lattice mismatch, or on silicon carbide (SiC) substrates having about 3.4% lattice mismatch. It has been shown that these "foreign" substrates are typically not desirable. For example, as-grown GaN films on sapphire substrates have been shown to contain a high density of defects (e.g. mainly threading dislocations) due to the substantial lattice mismatch and thermal expansion coefficient difference between the GaN epilayers and the substrates.

Progressing from "foreign" substrates, there are other substrates, for example, silicon (Si) or silicon-on-insulator (SOI) substrates that can be used for the heteroepitaxial growth of GaN. Growth of GaN on Si (111) substrates may potentially provide an option of using silicon as a less expensive or more accessible alternative to traditional substrates. Potentially, GaN-based devices may be integrated on well-established silicon process technology. However, due to the large differences in lattice constants and thermal expansion coefficients, good quality GaN films on Si substrates cannot be obtained by metalorganic chemical vapor deposition (MOCVD). It has been proposed to use different buffer layers or intermediate layers, such as AlN and $Al_{0.27}Ga_{0.73}N$/AlN layers, to improve the GaN quality on Si. The large difference in the lattice and thermal mismatch can be avoided if suitable growth conditions are used. Apart from high-temperature AlN buffers, the method by Wang et al. described in "Effects of periodic delta-doping on the properties of GaN:Si films grown on Si(111) substrates" Appl. Phys. Lett. 85, 5881 (2004), uses suitable Si-delta-doped interlayers to reduce the cracks and tensile stress.

The integration of GaN-based devices to Si electronics can be possible if good quality wurtzite GaN epilayers can be grown on Si (100) or SOI substrates. Zhou et al, in "Comparison of the properties of GaN grown on complex Si-based structures", Appl. Phys. Lett., 86, 081912 2005, describe GaN growth on SOI (111) that is related to integration. SOI-based technology is typically being used in microscale applications that include electronic and microelectromechanical system (MEMS) devices where single crystal silicon can offer advantages such as process control and providing reliable electronic and mechanical properties. SOI wafers can typically be prepared using methods such as wafer bonding, Smart-cut processes and the so-called Separation by Implantation of Oxygen (SIMOX) method. Using SOI substrates can provide some advantages over using sapphire or SiC substrates. The advantages include the availability of large size substrates (e.g. up to 12 in.), relatively lower cost, and easier integration with Si-based microelectronics.

M. A. Shah, S. Vicknesh, L. S. Wang, J. Arokiaraj, A. Ramam, S. J. Chua and S. Tripathy, "Fabrication of Free-standing GaN Micromechanical Structures on Silicon-on-Insulator Substrates", Electrochem. Solid-State Lett., 8, G275 2005 describe the growth of GaN-based epilayers on (100) oriented SOI substrates prepared by the SIMOX method using MOCVD and the fabrication processes to realize GaN based micromechanical structures on a SOI platform. L. S. Wang, S. Tripathy, S. J. Chua and K. Y. Zang, "InGaN/GaN multi-quantum-well structures on (111)-oriented bonded silicon-on-insulator substrates", Appl. Phys. Lett., 87 111908 2005 describe the growth of InGaN/GaN multiple quantum wells (MQWs) with sharp interfaces on (111)-oriented bonded SOI substrates.

One problem that may arise during development of GaN-based MEMS is a lack of efficient sacrificial etchants. Publications such as R. P. Strittmatter, R. A. Beach, T. C. McGill, "Fabrication of GaN suspended microstructures", Appl. Phys. Lett., 78 3226 2001 and A. R. Stonas, N. C. MacDonald, K. L. Turner, S. P. DenBaars, E. L. Hu, "Photoelectrochemical undercut etching for fabrication of GaN microelectromechanical systems", J. Vac. Sci. Technol., B 19 2838 2001 and A. R. Stonas, P. Kozodoy, H. Marchand, P. Fini, S. P. DenBaars, U. K. Mishra and E. L. Hu, "Backside-illuminated photoelectrochemical etching for the fabrication of deeply undercut GaN structures", Appl. Phys. Lett., 77 2610 2000 describe fabrication processes of III-nitrides-based MEMS using chemical etching.

In publications such as S. Davies, T. S. Huang, M. H. Gass, A. J. Papworth, T. B. Joyce, P. R. Chalker, "Fabrication of GaN cantilevers on silicon substrates for microelectromechanical devices", Appl. Phys. Lett., 84 2556 2004, S. Davies, T. S. Huang, R. T. Murray, M. H. Gass, A. J. Papworth, T. B. Joyce, P. R. Chalker, "Fabrication of epitaxial III-nitride cantilevers on silicon (111) substrates", J. Mat. Sci., 15 705 2004, Z. Yang, R. N. Wang, S. Jia, D. Wang, B. S. Zhang, K. M. Lau, and K. J. Chen, "Mechanical characterization of suspended GaN microstructures fabricated by GaN-on-patterned-silicon technique", Appl. Phys. Lett., 88, 041913 2006 and Z. Yang, R. Wang, D. Wang, B. Zhang, K. M. Lau, K. J. Chen, "GaN-on-patterned-silicon (GPS) technique for fabrication of GaN-based MEMS", Sensors and Actuators A, Accepted for Publication (Inpress), combined dry and wet chemical etching steps have been described to realize GaN surface micromachined microstructures on Si(111) substrates. However, one disadvantage with using a wet chemical for sacrificial etching is the released microstructures must be dried in a way so as to prevent the microstructures from collapsing due to meniscus forces (stiction).

That is, the typical process to obtain free-standing surface-micromachined structures is to rinse the wet chemical etchant used to free the structures with deionized (DI) water and dry the structures using evaporation. Using this process, a flexible microstructure can be pulled down to the substrate by the capillary force of water droplets in e.g. the airgap and may remain stuck to the substrate even after the microstructure is completely dried. Studies have shown that factors such as solid bridging, van der Waals forces and electrostatic forces can give rise to stiction.

In addition to GaN, another material that is suitable for use in photonic and electronic applications is Zinc Oxide (ZnO). ZnO is typically used in a wide range of applications such as in semiconducting, photoconducting, piezoelectric sensors and optical waveguides. ZnO has a number of unique properties such as having a direct wide band gap (e.g. $E_g$ ~3.3 eV at 300K) and a large exciton binding energy (~60 meV). Typically, ZnO is used for semiconductor devices operating in harsh environments, such as in space and nuclear reactors, because it is more radiation-resistive than materials such as Si, GaAs, SiC, or GaN.

For using ZnO for MEMS applications, one problem that may arise is ZnO material is easily etched by wet chemical etchants that are typically used for sacrificial etching. Thus, to realize ZnO MEMS, it is desirable to develop a dry-releasing technique.

Further to the above, yet other alternative materials for developing MEMS for use in harsh environments include microcrystalline and nanocrystalline diamond (NCD). Such materials have significant mechanical strength, chemical inertness, thermal stability and tribological performance. Freestanding NCD-mechanical structures are typically fabricated using $SiO_2$ as a sacrificial layer. However, the $SiO_2$ sacrificial layer is typically removed using hydrofluoric (HF) wet and/or gas etch. One disadvantage with wet chemical for sacrificial etching is the released diamond microstructures must be dried in such a way so as to prevent the structures from collapsing due to meniscus forces. This is the stiction discussed above.

Therefore, to realize e.g. wide bandgap ultra-nanocrystalline and microcrystalline diamond micromechanical structures and/or for realizing surface micromachined GaN and ZnO microstructures without stiction related problems, a dry release technique is desired.

For etching silicon, gas phase pulse etching using Xenon Difluoride ($XeF_2$) has been used as a silicon etchant. $XeF_2$ is a member of a family of fluorine-based silicon etchants which includes $ClF_3$, $BrF_3$, $BrF_5$, and $IF_5$. High etch rates and reaction probabilities at room temperature were found when $XeF_2$ vapor was first used to study the mechanisms of fluorine etch chemistry on silicon. As a silicon etchant, $XeF_2$ has unique properties such as an ability to etch without excitation or external energy sources thus exhibiting a high selectivity to many metals, dielectrics and polymers used in traditional integrated circuit fabrication, providing isotropic etching, and providing gentle dry reaction etching. $XeF_2$ is a white solid material at room temperature and at atmospheric pressure. In a vacuum environment, solid $XeF_2$ instantly sublimates and isotropically etches silicon without physical excitation.

Hoffman et al. in "3D structures with piezoresistive sensors in standard CMOS," Proceedings of Micro Electro Mechanical Systems Workshop (MEMS '95), 288 1995 describe creating 3-dimensional structures with piezoresistive sensors in a standard CMOS process using $XeF_2$ to bulk micromachine the chips. Further, U.S. Pat. Nos. 7,041,224B2, 6,942,811B2, 6,960,305 and 7,027,200B2 describe apparatus improvements (e.g. to accurately determine the end-point of the etch step) and methods used in etching of sacrificial silicon layers for a micromechanical structure (e.g. a micromirror array for a projection display and silicon-based deflectable MEMS elements) by the use of gas phase etchants, particularly in the absence of plasma (such as $XeF_2$ with one or more diluents). Thus, silicon can be preferentially etched with respect to non-silicon materials, which include titanium, gold, aluminum, and compounds of these metals as well as silicon carbide, silicon nitride, photoresists, polyimides, and silicon oxides. Jang et al. in US20030193269A1 describe a method of forming a film bulk acoustic resonator (FBAR) having an activation area resonating with a predetermined frequency signal. The method includes forming a poly silicon layer as the sacrificial layer followed by removing the sacrificial layer using $XeF_2$ to form a corresponding air-gap. The method further includes forming a thin layer made of dielectric material, such as AlN or ZnO, on a semiconductor substrate, such as silicon or GaAs, to generate a resonance using a piezoelectric characteristic of the thin layer.

In the above publications, for using $XeF_2$ for dry etching, a sacrificial layer is typically deposited and patterned as additional process steps so that an airgap may be formed after the $XeF_2$ dry etching. However, depositing and patterning of the sacrificial layer can give rise to increased complexity in the fabrication process and may incur additional cost.

Hence, there exists a need for a micromechanical structure and a method of fabricating a micromechanical structure that seek to address at least one of the above problems.

SUMMARY

In accordance with an aspect of the present invention, there is provided a micromechanical structure comprising a silicon (Si) based substrate; a micromechanical element formed directly on the substrate; and an undercut formed underneath a released portion of the micromechanical element; wherein the undercut is in the form of a recess formed in the Si based substrate.

The Si based substrate may comprise a silicon-on-insulator (SOI) substrate.

A thickness of a Si overlayer of the SOI substrate may be chosen for controlling a stress in the released portion of the micromechanical element.

The recess may extend through substantially the thickness of the Si overlayer of the SOI substrate.

The thickness may be in a range of about 10 nm to about 10 μm.

The SOI substrate may be provided using wafer bonding, Separation by Implantation of Oxygen (SIMOX) or both.

A crystalline orientation of the SOI substrate may be chosen for controlling the stress in the released portion of the micromechanical element.

The crystalline orientation may be (100) or (111).

The Si based substrate may comprise a bulk Si substrate.

The bulk Si substrate may comprise a crystalline orientation of (100) or (111).

The micromechanical element may comprise one or more materials selected from a group consisting ZnO, Zn(Mg)O, Zn(Cd)O, ZnS, GaN, AlN, AlGaN, InGaN, InN, polycrystalline diamond and nanocrystalline diamond.

The recess may be formed in the Si based substrate using a dry etch process.

The dry etch process may comprise usage of $XeF_2$.

The micromechanical element may comprise an optoelectronic device.

The micromechanical element may comprise a microelectronic device.

The optoelectronic device may comprise a light emitting diode (LED).

The microelectronic device may comprise one or more Field-effect transistors (FETs).

In accordance with another aspect of the present invention, there is provided a method of fabricating a micromechanical structure, the method comprising the steps of providing a silicon (Si) based substrate; forming a micromechanical element directly on the substrate; forming an undercut in the form of a recess underneath a released portion of the micromechanical element; and forming the recess in the Si based substrate.

The Si based substrate may comprise a silicon-on-insulator (SOI) substrate.

The method may further comprise choosing a thickness of a Si overlayer of the SOI substrate for controlling a stress in the released portion of the micromechanical element.

The recess may extend through substantially the thickness of the Si overlayer of the SOI substrate.

The thickness may be in a range of about 10 nm to about 10 μm.

The Si based substrate may be provided using wafer bonding, Separation by Implantation of Oxygen (SIMOX) or both.

The method may further comprise choosing a crystalline orientation of the SOI substrate for controlling the stress in the released portion of the micromechanical element.

The crystalline orientation may be (100) or (111).

The Si based substrate may comprise a bulk Si substrate.

The bulk Si substrate may comprise a crystalline orientation of (100) or (111).

The micromechanical element may comprise one or more materials selected from a group consisting ZnO, Zn(Mg)O, Zn(Cd)O, ZnS, GaN, AlN, AlGaN, InGaN, InN polycrystalline diamond and nanocrystalline diamond.

The forming an undercut in the form of a recess may comprise using a dry etch process.

The dry etch process may comprise using $XeF_2$.

The micromechanical element may comprise an optoelectronic device.

The micromechanical element may comprise a microelectronic device.

The optoelectronic device may comprise a light emitting diode (LED).

The microelectronic device may comprise one or more Field-effect transistors (FETs).

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
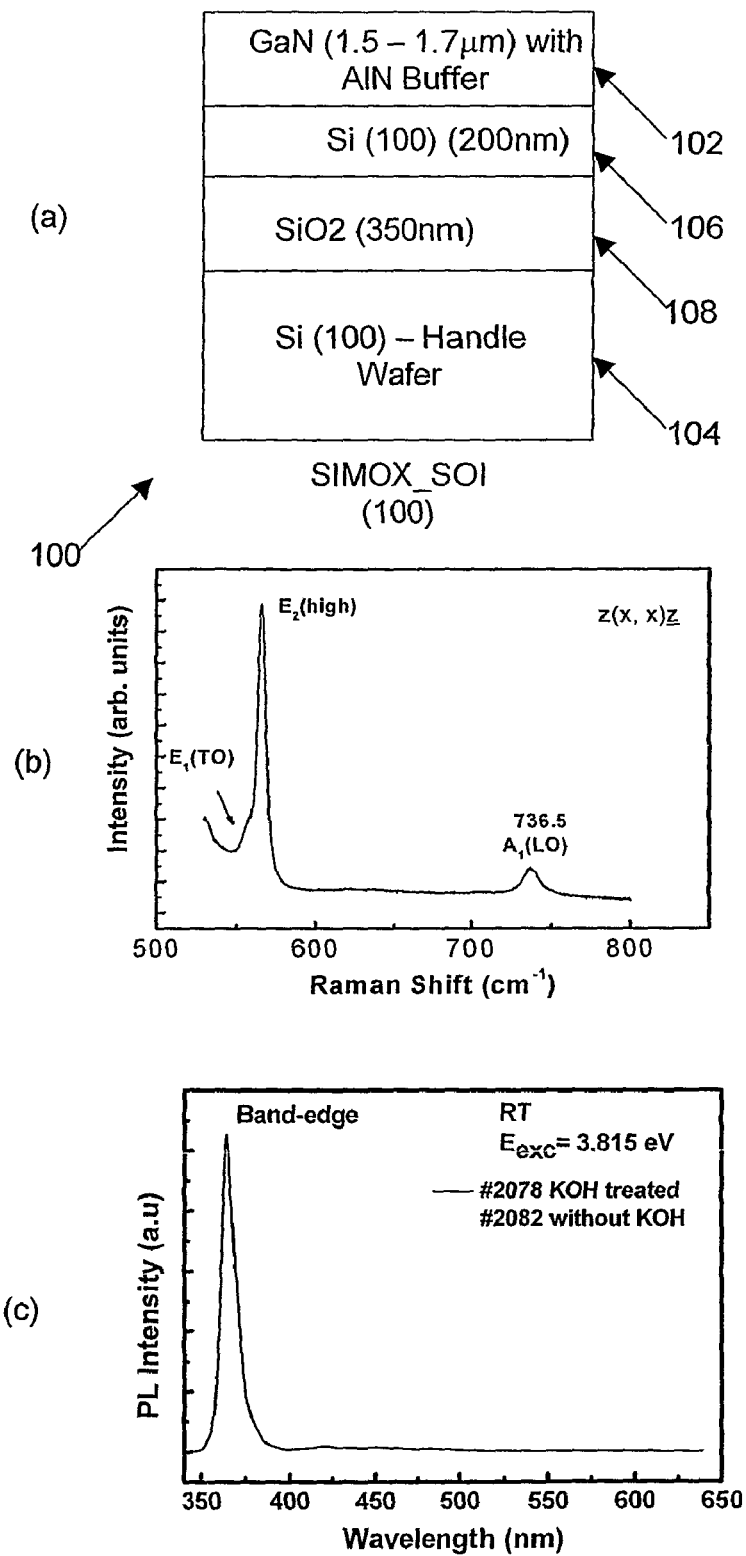
FIG. 1(a) is a schematic diagram illustrating a sample comprising a Gallium Nitride (GaN) layer formed on a Separation by Implantation of Oxygen silicon-on-insulator (SIMOX_SOI) (100) substrate in an example embodiment.
FIG. 1(b) is an intensity vs Raman shift graph showing a micro-Raman spectrum measured for the GaN layer.
FIG. 1(c) is a photoluminescence (PL) intensity vs wavelength graph showing a PL spectrum measured for the GaN layer.

Example embodiments described below can provide surface micro-machined wide bandgap nano/micromechanical structures (e.g. comprising ZnO, GaN, and nanocrystalline diamond) grown directly on Si and/or SOI substrates using a dry releasing technique. The dry releasing technique employed in the example embodiments is a controlled gas phase pulse etching with Xenon Difluoride ($XeF_2$) which can selectively etch Si and SOI overlayers inherent to the Si and/or SOI substrates, thus undercutting the wide bandgap material. In the example embodiments, the dry releasing technique is used to etch a "sacrificial layer" of Si or Si overlayers inherent to the Si and/or SOI substrates, thus creating an airgap for any wide bandgap materials grown on top of the Si and/or SOI substrates. Thus, in example embodiments, there is no requirement for depositing and patterning an additional, dedicated sacrificial layer. On the other hand, control of the thickness of the airgap can be maintained in example embodiments by providing e.g. SOI substrates with a chosen Si overlayer thickness. In other words, in such embodiments, the control of the airgap thickness is advantageously separated from the device buildup processes, e.g. depositing GaN, ZnO, NCD materials etc. onto the substrates, and rather is incorporated into the pre-fabrication of SOI wafers by a simple control of silicon thickness in e.g. well-established SOI formation techniques such as wafer bonding, SIMOX etc.

For control of the silicon thickness using SIMOX, reference is made to publications M. Bruel, "Silicon on insulator material technology", *Electron. Lett.*, 31, 1201 1995, M. Bruel, B. Aspar, and A. J. Auberton-Hervé, "Smart-Cut: A New Silicon On Insulator Material Technology Based on Hydrogen Implantation and Wafer Bonding", *Jpn. J. Appl. Phys.*, Part 1, 36, 1636 1997 and O. W. Holland, D. Fathy, and D. K. Sadana, "Formation of ultrathin, buried oxides in Si by $O^+$ ion implantation", *Appl. Phys. Lett.*, 69, 674 1996.

As the thickness of the silicon overlayer is controlled during substrate fabrication, the thickness of the airgap formed can be controlled. Thus, residual stress of the wide bandgap materials can be controlled by designing the silicon overlayer inherent to the substrates below the wide bandgap materials. In such example embodiments, as $XeF_2$ is highly selective to dielectrics, the $XeF_2$ selectively etches the silicon overlayers inherent to the substrates to form corresponding airgaps. It will be appreciated that the $XeF_2$ does not etch underlying $SiO_2$ below the silicon overlayers of the SOI substrates. Thus, the $SiO_2$ layer of a SOI substrate functions as an inherent etch stop.

In the following description, sample preparation/formation for the example embodiments and characterization techniques are briefly introduced before the example embodiments are described in more detail.

For some example embodiments, GaN-based epilayers are grown on commercially obtained (100) and (111) oriented SOI substrates fabricated by the SIMOX method using MOCVD. Such substrates can provide a buried oxide layer of about 150-350 nm thickness and a Si overlayer of about 50-200 nm. In one sample, a GaN layer with a thin AlN buffer is grown on a Si (111) substrate to highlight the potential of the dry releasing technique for fabrication of GaN micromechanical structures directly on bulk Si (111). In such example embodiments, the GaN layers grown on bulk silicon (111) and SOI substrates are subjected to periodic delta doping to reduce cracks and tensile stress. It will be appreciated that growing the layers on e.g. AlN buffers and using periodic delta doping steps during MOCVD epitaxy can produce good GaN epitaxy on Si(111). Such growth methods can also be applied to SIMOX SOI(111) and SOI(100) substrates. In addition, for some example embodiments, to demonstrate using other wide bandgap materials, ZnO material is deposited/grown e.g. by RF magnetron sputtering on (111) oriented SOI substrates fabricated by the SIMOX method and on wafer bonded SOI substrates. In some samples, the buried oxide layers range from about 370 nm to 2.0 μm thickness and the Si overlayers range from about 200 nm to 3.0 μm.

The ZnO and GaN samples are characterized by optical techniques such as micro-photoluminescence (PL) and micro-Raman measurements.

For some example embodiments, ultra-nanocrystalline diamond (UNCD) films of about 2.0 μm thick are grown on Si-based substrates by microwave plasma chemical vapor deposition techniques. These films can show ultra smooth diamond morphology and the nature of the crystalline quality can be studied by micro-Raman spectroscopy.

The samples described above are diced into 2×2 cm samples. The samples are cleaned in a Class 100 cleanroom using Acetone and Methanol in an ultrasonic bath for a period of about 5 minutes for each solvent. Thereafter, the samples are rinsed under DI water, blow dried with N2 gas and prebaked in an oven (e.g. Memmert) at about 90° C. for about 10 minutes. After heating, the samples are spin-coated using a Spincoater (e.g. Model CEE 100 from Brewer Science, INC.) with AZ4330 photoresist (PR) at about 5000 rpm for about 30 seconds. The samples are then placed in an oven for soft baking at about 90° C. for about 30 minutes. Photolithography is then performed using a Karl Suss Mask Aligner (MA8) I-line, with ultraviolet light (about 365 nm) with an intensity of approximately 4.5-5 mW. In the example embodiments, 3" mask plates with features of different membrane, cantilever and bridge dimensions are used for patterning. After the photolithography, before etching, the photoresist thicknesses were measured to be approximately 3 μm on the patterned samples.

For etching, the samples are etched in a load-locked Unaxis SLR 770 high-density plasma etch system consisting of an inductive coupled plasma (ICP) chamber (operating at about 2 MHz) and an additional RF bias (about 13.56 MHz) for the sample chuck. Helium backside cooling is incorporated to allow the temperature of the sample substrates to be more effectively controlled. The samples are mounted on an 8-in.-Si carrier wafer with vacuum grease before they are introduced in the etching chamber. Boron Trichloride ($BCl_3$) and Chlorine ($Cl_2$) gases of purity 99.999% are introduced for structural etching. The samples are etched in the ICP chamber for a duration of time, depending on the type of wide bandgap material, using constant process parameters of about 20 sccm $BCl_3$ flow, 10 sccm $Cl_2$ flow, 500 W ICP power, 200 W Reactive Ion Etching (RIE) power, 5 mTorr pressure and 6° C. temperature.

After etching, etch depths of the remaining material and photoresist are determined by using a KLA Tencor P-10 Surface Profiler. Photoresist is stripped off using acetone and step heights of the etched material are measured again using the surface profiler. This is to ascertain the exposure conditions of underlying layers (inherent to the substrates) below the wide bandgap materials for a subsequent sacrificial layer etching. For the samples, releasing the respective wide bandgap material is achieved by sacrificial etching of the respective substrate Si overlayer using $XeF_2$ in a customized Penta Vacuum System. Images of the released wide bandgap structures are captured in a secondary electron imaging (SEI) mode using a JEOL JSM 5600 scanning electron microscope (SEM) equipped with a resolution of about 3.5 nm and accelerating voltage in the range 5 kV-10 kV.

Further, the released samples are characterized by spatially resolved Raman scattering in the back scattering geometry at room temperature. The 514.5 nm line of an argon ion laser is used for the Raman scattering measurement. The scattered light is dispersed through a JY-T64000 triple monochromator system attached to a liquid nitrogen cooled charge coupled device (CCD) detector. The accuracy of the Raman measurements is about 0.2 $cm^{-1}$ with a lateral spatial resolution of about 1.2 μm. The samples are subjected to excitation perpendicular to the substrates and the back scattering light is detected by the same objective used to focus the incident laser light.

After the brief introduction of the sample preparation/formation and characterization techniques, the example embodiments are described in more detail in the following description.

FIG. 1(a) is a schematic diagram illustrating a sample 100 comprising a GaN layer 102 formed on a SIMOX_SOI (100) substrate 104 in an example embodiment. The GaN layer 102 of about 1.5 to 1.7 μm is formed directly on the substrate 104 without depositing an additional or "dedicated" sacrificial layer. The substrate 104 inherently comprises an "inherent" Si overlayer 106 of about 200 nm thickness and an "inherent" buried oxide layer 108 of about 350 nm thickness. The sample 100 is patterned with features of different membrane sizes using standard photolithography and is etched for a period of about 11 mins to a depth of about 2 μm using constant process parameters of about 20 sccm $BCl_3$ flow, 10 sccm $Cl_2$ flow, 500 W ICP power, 200 W RIE power, 5 mTorr pressure and 6° C. temperature.

Thus, it will be appreciated that the control of airgap thickness is advantageously separated from the device buildup processes and is provided by a control of the "inherent" Si overlayer thickness.

FIG. 1(b) is an intensity vs Raman shift graph showing the micro-Raman spectrum measured for the GaN layer 102. FIG. 1(c) is a PL intensity vs wavelength graph showing the PL spectrum measured for the GaN layer 102.

Figure 2:
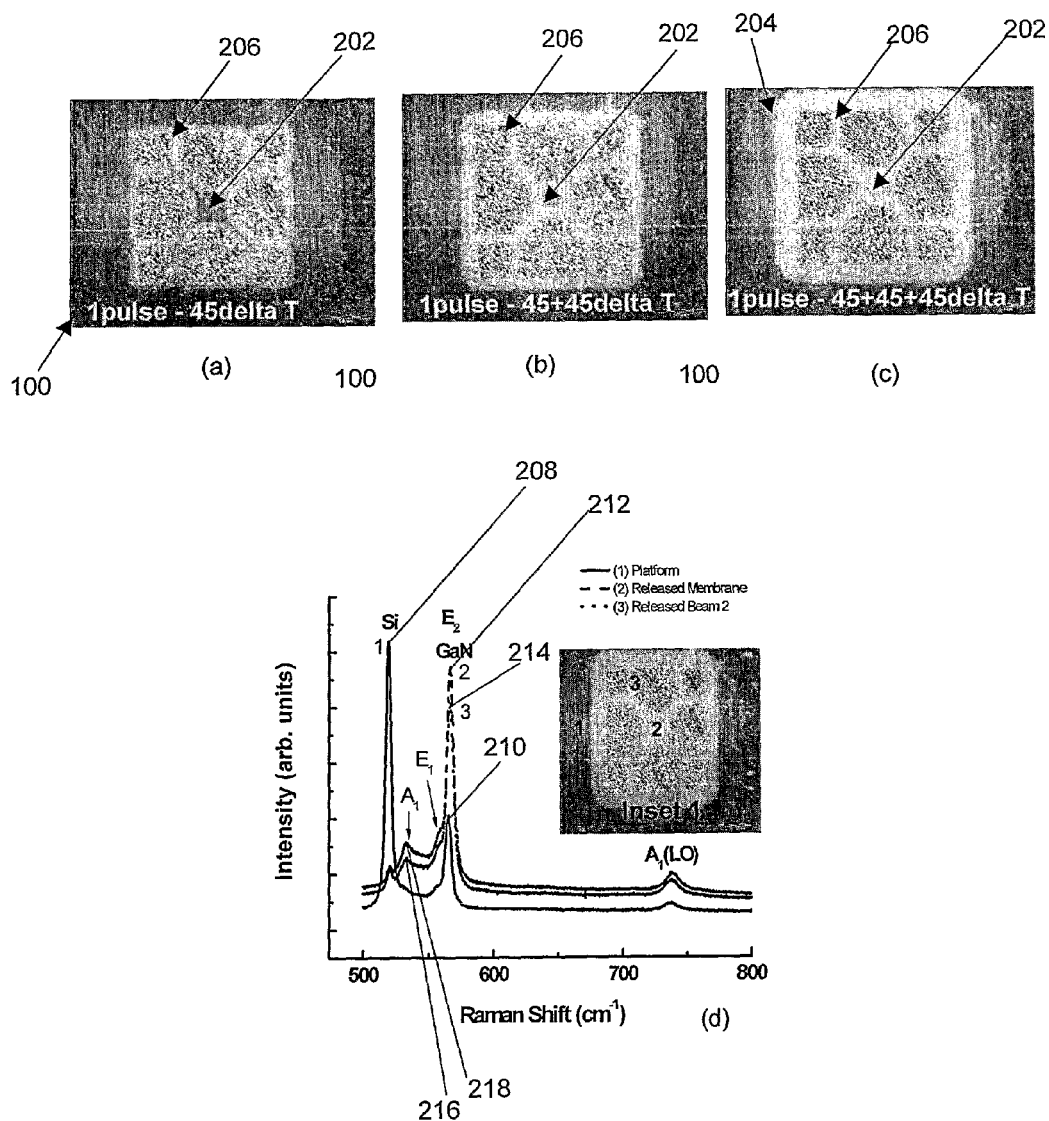
FIGS. 2(a) to (c) are microscope images showing the sample after Xenon Difluoride ($XeF_2$) etching at progressive time intervals of 45 delta T.
FIG. 2(d) is an intensity vs Raman shift graph showing measured micro-Raman spectra of the sample of FIG. 2(c).

The sample 100 is then subjected to $XeF_2$ etching of the Si overlayer 106 using a single pulse of progressive timings. FIGS. 2(a) to (c) are microscope images showing the sample 100 after $XeF_2$ etching at progressive time intervals of 45 delta T, where T is time in seconds. From FIGS. 2(a) to (c), it is observed that the contrast of a membrane 202 of the sample 100 has changed indicating formation of an airgap under the membrane 202. In FIG. 2(c), the contrast of the entire membrane 202 is much lighter as compared to a platform 204 of the sample 100 indicating a freestanding GaN membrane 202 on the SOI substrate 104 (FIG. 1(a)). The released membrane 202 of FIG. 2(c) (see also Inset 1) is characterized using the micro-Raman technique and the spectra from three positions ie. at the platform 204, at the released membrane 202 and at a beam 206 are measured. FIG. 2(d) is a set of intensity vs Raman shift graphs showing the measured micro-Raman spectra.

For the measurements of FIG. 2(d), the visible 514.5 nm of the argon ion laser probes the whole GaN layer 102 (FIG. 1(a)) as well as the silicon overlayer 106 (FIG. 1(a)) due to the laser penetration depth. The platform 204 is measured first followed by the membrane 202 and the beam 206. From the spectra of FIG. 2(d), it can be observed that the platform 204 has a strong Si intensity at 520 $cm^{-1}$ (see numeral 208) while the $E_2$ phonon intensity of GaN of the platform 204 is the weakest at 565.9 $cm^{-1}$ (see numeral 210). For the released membrane 202 and the beam 206, the $E_2$ phonon intensities are the strongest at 567.3 $cm^{-1}$ (see numeral 212) and 567.1 $cm^{-1}$ (see numeral 214) respectively while the Si intensity is the weakest at 520.5 $cm^{-1}$ (see numerals 216 and 218). The $E_2$ phonon frequency can be used to monitor the in-plane stress in the GaN film and the $E_2$ phonon line of GaN on the SOI substrate (ie. the platform 204) shows a shift towards the lower-energy side when compared to the $E_2$ phonon line of beams e.g. 206 and membranes e.g. 202. The observed red-shift is due to the presence of tensile stress when compared to the reference phonon peak of a standard strain-free 400 μm thick freestanding GaN. For the reference phonon peak of a standard strain-free 400 μm thick freestanding GaN, please refer to R. Armitage, Q. Yang, H. Feick, J. Gebauer, E. R. Weber, S. Shinkai, and K. Sasaki, "Lattice-matched HfN buffer layers for epitaxy of GaN on Si", *Appl. Phys. Lett.*, 81, 1450 2002 and L. S. Wang, K. Y. Zang, S. Tripathy, and S. J. Chua, "Effects of periodic delta-doping on the properties of GaN:Si films grown on Si (111) substrates", *Appl. Phys. Lett.*, 85, 5881 2004. The strong $E_2$ phonon intensity for the released membrane and beam (see numerals 212, 214) clearly indicates that the Si overlayer 106 (FIG. 1(a)) of about 200 nm thickness has been completely etched. This is shown using the micro-Raman spectra of FIG. 2(d) and the contrast of the microscope image in FIG. 2(c) of the released membrane 202.

Figure 3:
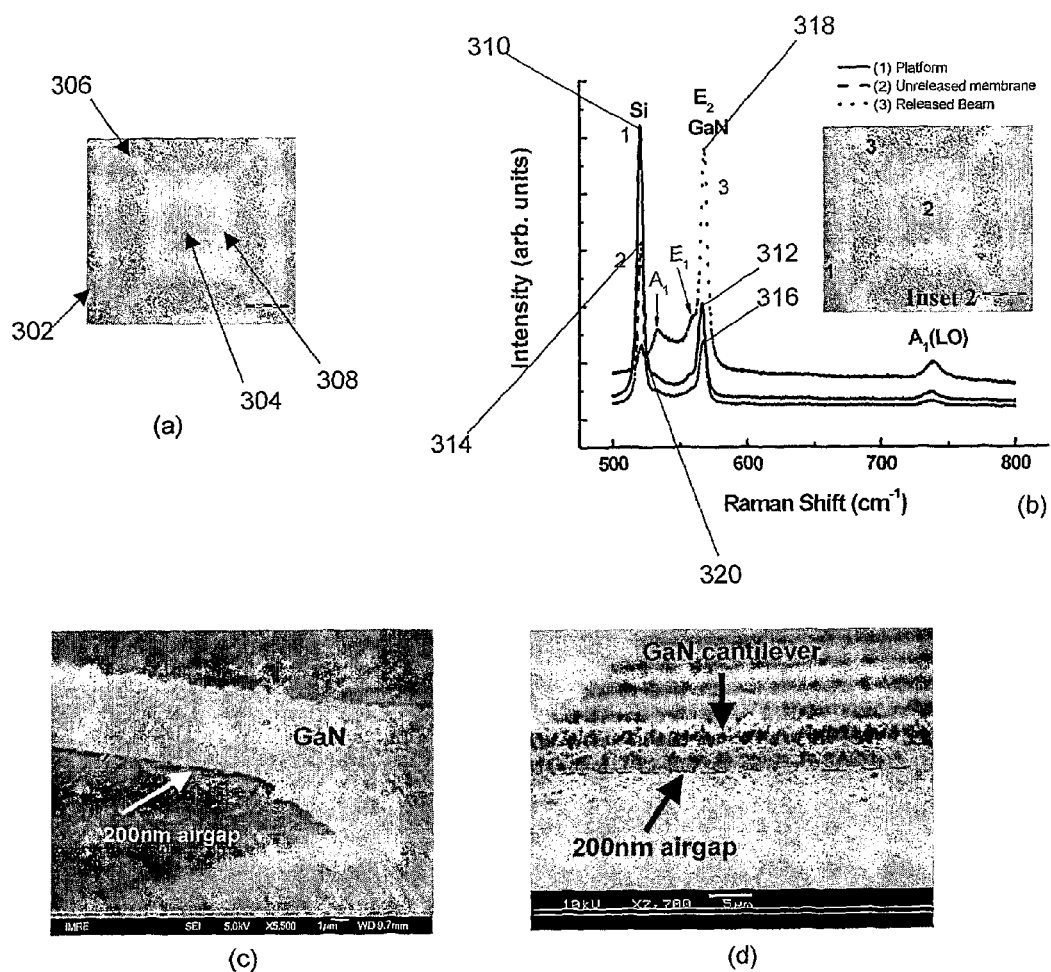
FIG. 3(a) is a microscope image of a sample with a larger membrane size in another example embodiment.
FIG. 3(b) is an intensity vs Raman shift graphs showing a measured micro-Raman spectra of the sample of FIG. 3(a).
FIG. 3(c) is a Scanning Electron Microscope (SEM) image showing an airgap under a sample GaN cantilever structure on the SIMOX SOI(100) substrate of FIG. 1(a).
FIG. 3(d) is a SEM image showing an airgap under sample GaN beams attached to freestanding membranes on a sample SIMOX SOI(100) platform.

Although the etching of Si with $XeF_2$ is highly selective, it is also time dependent. FIG. 3(a) is a microscope image of a sample 300 with a larger membrane size in another example embodiment. The sample 300 is etched with $XeF_2$ and micro- Raman spectra measurements are taken from a platform 302, a membrane 304 and a beam 306. The etching with XeF$_2$ is carried out with the same timing for XeF$_2$ etching the sample 100 of FIGS. 2(a) to (c). From FIG. 3(a), it is observed that the centre of the membrane 304 has a darker contrast as compared to the edges e.g. 308 of the membrane 304 and the beam 306. The edges e.g. 308 of the membrane 304 and the beam 306 are similar in contrast to the platform 302.

FIG. 3(b) is an intensity vs Raman shift graph showing the measured micro-Raman spectra. The platform 302 is measured first followed by the membrane 304 and the released beam 306. From the spectra, it can be observed that the platform 302 has a strong Si intensity at 520 cm$^{-1}$ (see numeral 310) while the E$_2$ phonon intensity has a weak signal at 565.9 cm$^{-1}$ (see numeral 312). The unreleased membrane 304 has a moderately weak Si intensity at 520 cm$^{-1}$ (see numeral 314) and the weakest E$_2$ phonon intensity of GaN at 566.9 cm$^{-1}$ (see numeral 316). However, the released beam 306 has the strongest E$_2$ phonon intensity at 567.3 cm$^{-1}$ (see numeral 318) and the weakest Si intensity at 520 cm$^{-1}$ (see numeral 320). The E$_2$ phonon line of GaN on SOI substrate (ie the platform 302) is lower as compared to E$_2$ phonon line of the released beam 306. However, the E$_2$ phonon line of the unreleased GaN membrane 304 is similar to that of the released beam 306, indicating that the membrane 304 is approaching strain free but the presence of Si peak (see numeral 314) indicates that it is not completely released from the Si overlayer (not shown). It will be appreciated that a longer duration of XeF$_2$ etching can release the membrane 304.

In the above example embodiments, cross-section SEM can be used to study the released membrane and cantilever structures respectively of the sample 100 shown in FIGS. 2(a) to (c).

FIG. 3(c) is a SEM image showing an airgap under a sample GaN cantilever structure on the SIMOX SOI(100) substrate 104. FIG. 3(d) is a SEM image showing an airgap under sample GaN beams attached to freestanding membranes on a sample SIMOX SOI(100) platform. The SEM images of FIGS. 3(c) and (d) show GaN free-standing structures of about 1.7 μm thickness with airgaps of about 200 nm.

Figure 4:
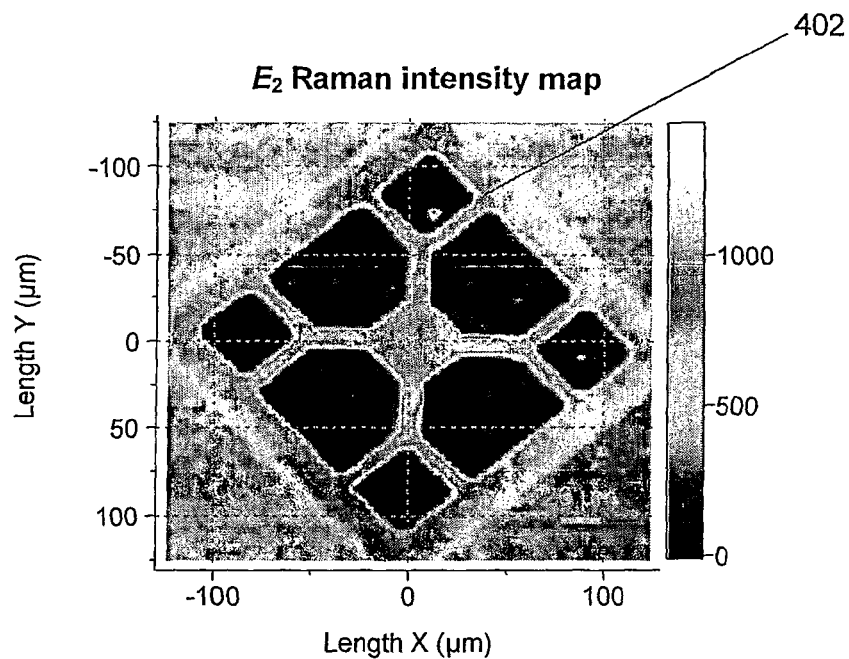
FIG. 4(a) is an $E_2$ phonon peak intensity mapping diagram of the sample of FIG. 2(c).
FIG. 4(b) is a Raman stress profile mapping diagram of the sample of FIG. 2(c).
Figure 4:
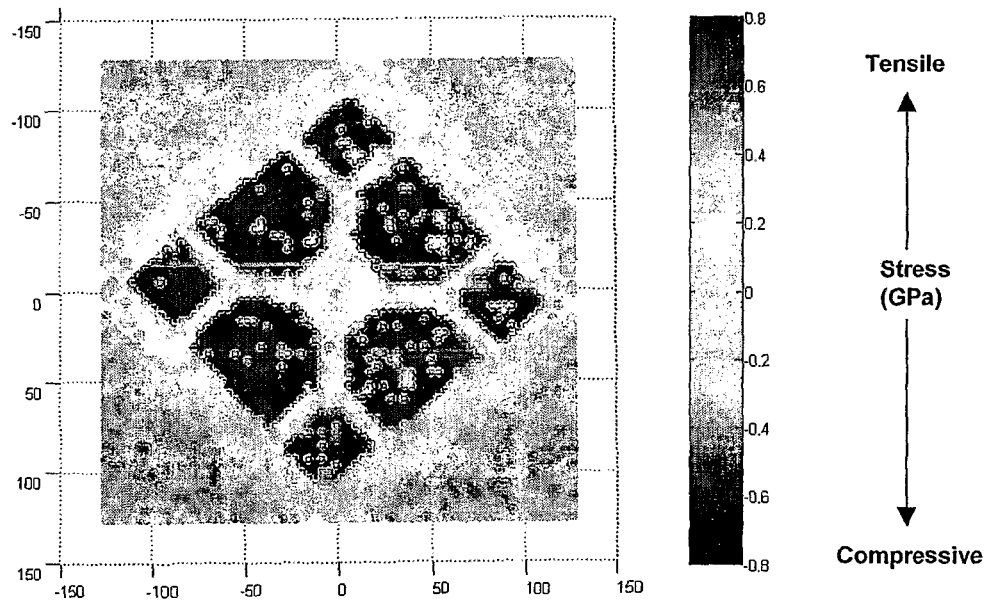

FIG. 4(a) is a E$_2$ phonon peak intensity mapping diagram of the sample 100 of FIG. 2(c). FIG. 4(b) is a Raman stress profile mapping diagram of the sample 100 of FIG. 2(c). Using the reference Raman peaks from a standard strain-free 400-μm-thick freestanding GaN, it can be confirmed that red-shifted phonon peaks e.g. 402 from GaN on the SOI substrate are due to the presence of in-plane tensile stress. The amount of tensile stress can be calculated using the expression $\Delta\omega=K\sigma$, where K is the proportionality factor given by 4.3 GPa$^{-1}$cm$^{-1}$. Raman measurements show that the GaN released by XeF$_2$ dry etching is approaching towards a stress-free phonon peak. The stress variation in the GaN released membrane 202 (FIG. 2(c)) is about +0.1 to +0.2 GPa whereas in the GaN/SOI (100) platform 204 (FIG. 2(c)), the stress is about 0.45±0.05 GPa. Experiments were conducted using SIMOX SOI(111) substrates with varying Si overlayer thicknesses of about 50, 100 and 200 nm inherent to the substrates. The residual stress in the 200 nm SOI(111) substrate was found to be in the range of about 0.32-0.40 GPa and was found to be reduced to about 0.2 GPa for the case of GaN grown on the 50 nm SOI(111) substrate. By controlling such growth-induced stress, the curling and bending of microstructures after dry release was found to have been minimized.

In another example embodiment, a similar XeF$_2$ dry-etching process and characterization is carried out for a GaN/SOI (111) platform.

In yet another example embodiment, surface micromachining is performed on a GaN layer formed directly on a bulk Si(111) substrate without depositing an additional or "dedicated" sacrificial layer. This can demonstrate the feasibility of using dry etching for creating large airgaps and can be for checking mechanical stability of freestanding GaN membranes and cantilevers formed after the dry etching.

Figure 5:
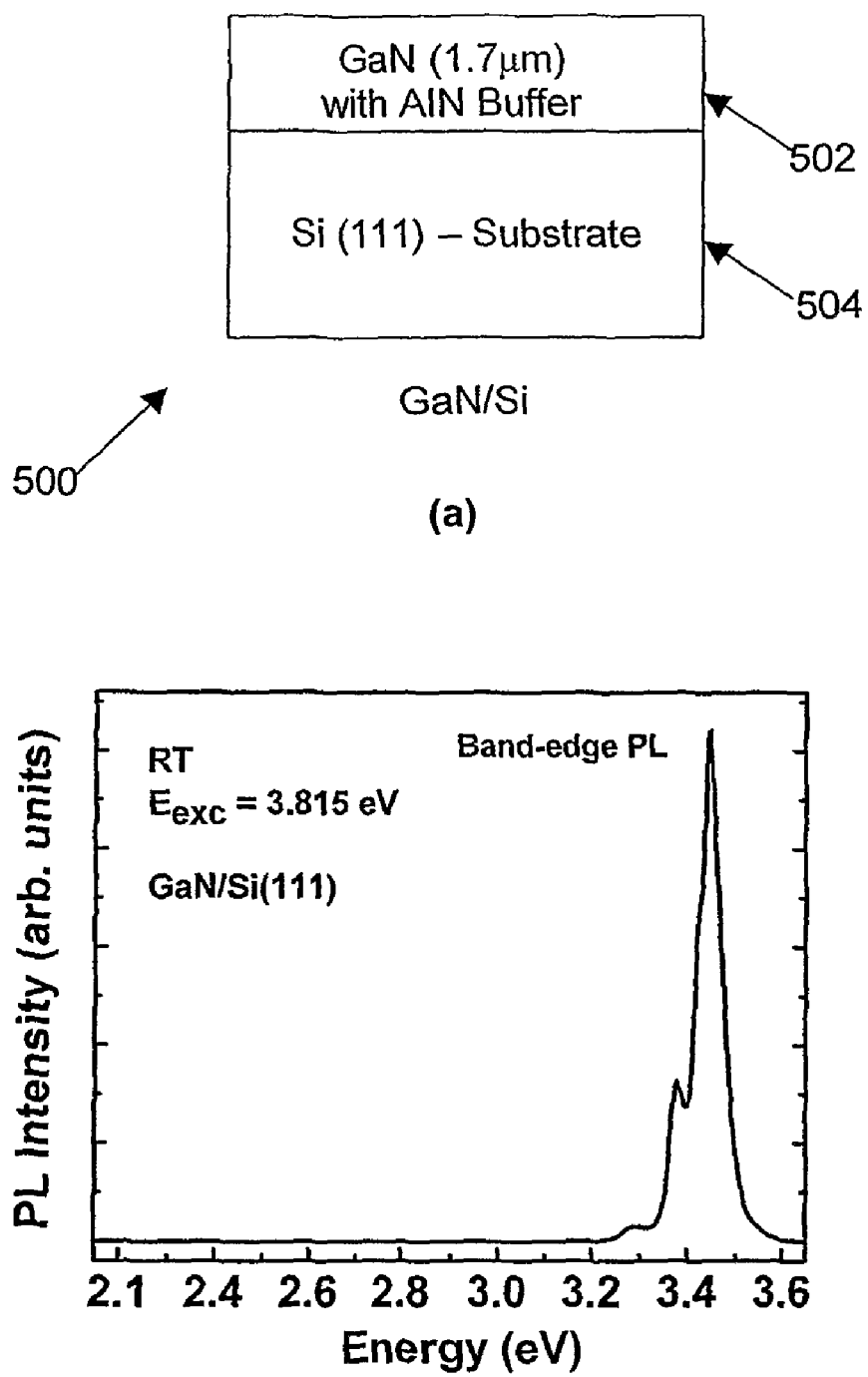
FIG. 5(a) is a schematic diagram illustrating a sample comprising a GaN epilayer having a high-temperature aluminium nitride (AlN) buffer layer grown on a Si(111) substrate in an example embodiment.
FIG. 5(b) is a PL intensity vs bandgap energy graph showing a PL spectrum of the sample of FIG. 5(a).

FIG. 5(a) is a schematic diagram illustrating a sample 500 comprising a GaN epilayer 502 having a high-temperature AlN buffer layer grown on a Si(111) substrate 504 in the example embodiment. The GaN epilayer 502 has a thickness of about 1.7 μm. FIG. 5(b) is a PL intensity vs bandgap energy graph showing the PL spectrum of the sample 500. Measurements such as X-ray diffraction rocking curves, transmission electron microscopy (TEM) and Raman measurements (not shown) indicate that the single crystalline GaN grown on bulk Si(111) can possess good optical quality.

The sample 500 is patterned with features of different membrane sizes using standard photolithography and is etched for a period of about 9 mins to a depth of about 2.5 μm using constant process parameters of about 20 sccm BCl$_3$ flow, 10 sccm Cl$_2$ flow, 500 W ICP power, 200 W RIE power, 5 mTorr pressure and 6° C. temperature. Subsequently, the sample 500 is subjected to XeF$_2$ etching of the Si handle wafer for a single pulse of progressive timings.

Figure 6:
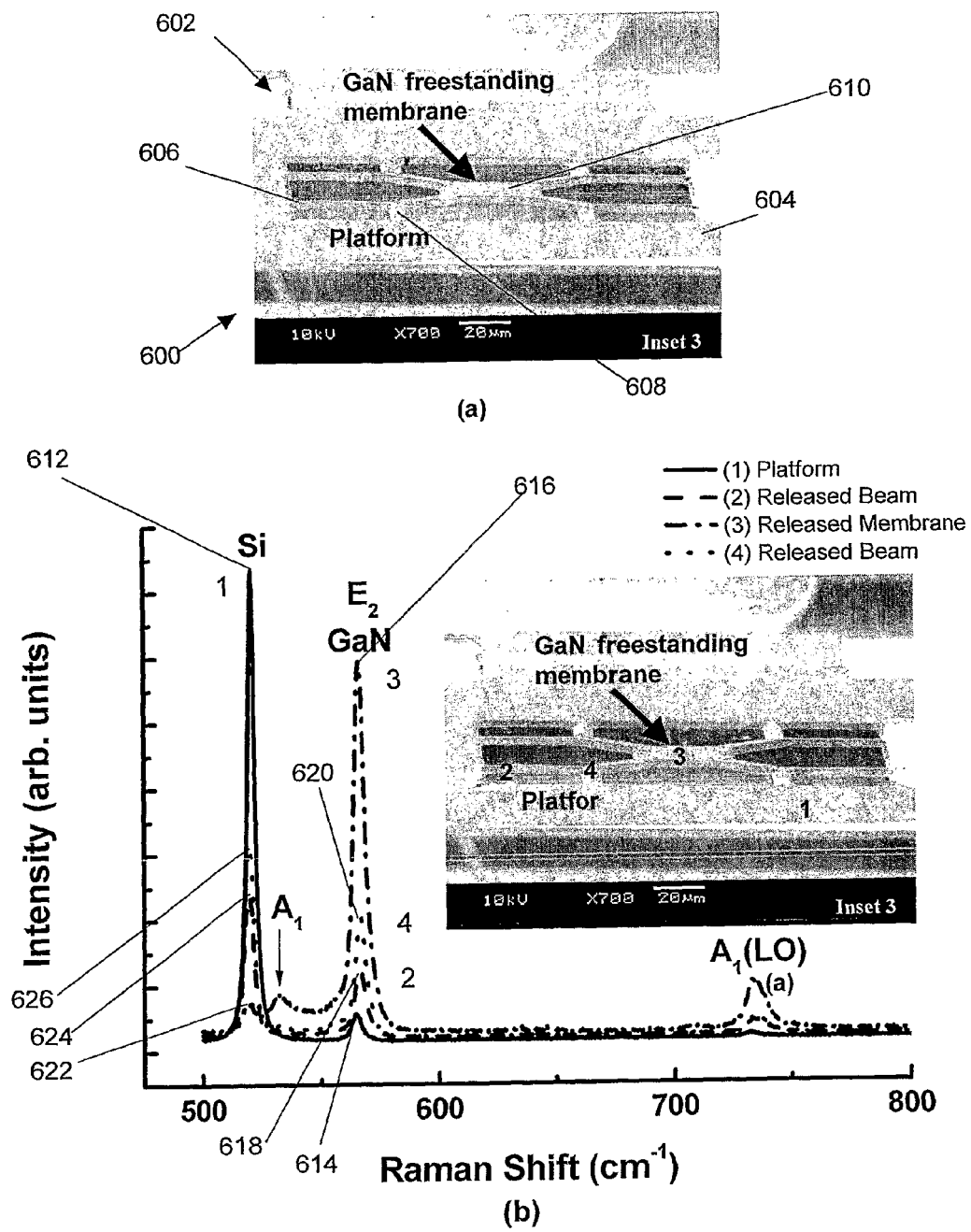
FIG. 6(a) is a scanning electron microscope (SEM) image of a released GaN structure of the sample of FIG. 5(a).
FIG. 6(b) is an intensity vs Raman shift graph showing a micro-Raman spectrum measured for the GaN structure of FIG. 6(a).
FIG. 6(c) is an $E_2$ phonon peak intensity mapping diagram of the GaN structure of FIG. 6(a).
FIG. 6(d) is a Raman stress profile mapping diagram of the GaN structure of FIG. 6(a).
Figure 6:
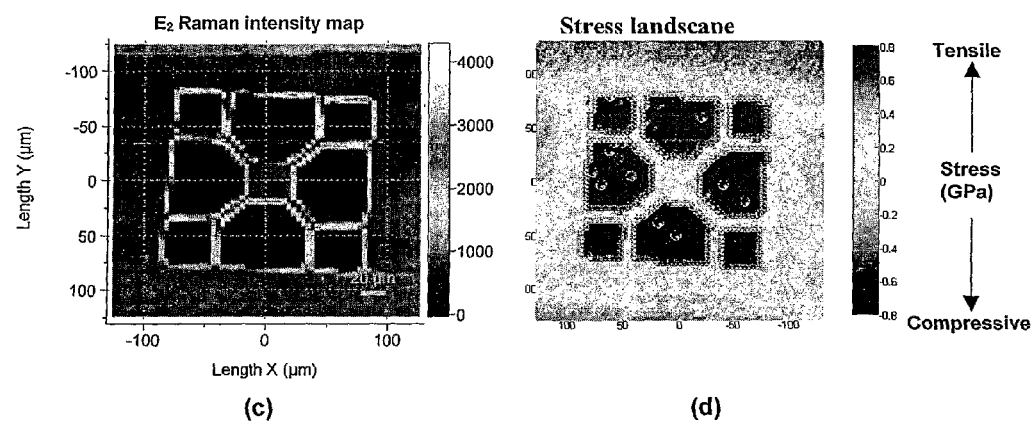

Microscope images of the sample 500 etched using XeF$_2$ for progressive timings show a change in the contrast of a membrane of the sample 500, indicating the presence of an airgap (compare FIGS. 2(a) to (c)). FIG. 6(a) is a SEM image 600 of a released GaN structure 602. The structure 602 comprises a platform 604, released beams e.g. 606, 608 and a membrane 610. The structure 602 is characterized using the micro-Raman technique. FIG. 6(b) is an intensity vs Raman shift graph showing the micro-Raman spectrum measured for the GaN structure 602. The spectra from four positions, ie. the platform 604, the released beams e.g. 606, 608 and the membrane 610 are measured. The platform 604 is measured first followed by the membrane 610 and the two beams 606, 608.

From FIG. 6(b), it can be observed that the platform 604 has a strong Si intensity at 520 cm$^{-1}$ (see numeral 612) while the E$_2$ phonon intensity of GaN for the platform 604 is the weakest at 564.9 cm$^{-1}$ (see numeral 614). For the released membrane 610 and beams 606, 608, the E$_2$ phonon intensity of GaN is the strongest at 566.9 cm$^{-1}$ (see numerals 616, 618, 620 respectively) while the Si intensity is the weakest at 520 cm$^{-1}$ (see numerals 622, 624, 626 respectively) indicating that the underlying Si (111) handle wafer substrate 504 (FIG. 5(a)) has been etched, thus creating an undefined airgap. Similar to the observations after etching GaN on the SIMOX_SOI (100) substrate with XeF$_2$ (ie. compare FIG. 3(a)), GaN membranes with larger dimensions are not freestanding due to the time dependence of etching the Si underlayer.

FIG. 6(c) is an E$_2$ phonon peak intensity mapping diagram of the GaN structure 602 of FIG. 6(a). FIG. 6(d) is a Raman stress profile mapping diagram of the GaN structure 602 of FIG. 6(a). The E$_2$ Raman intensity at the etched sidewalls are slightly higher due to light scattering effects. Raman measurements show that the GaN release by XeF$_2$ dry etching is approaching towards a stress-free phonon peak. The stress variation in the GaN released membrane 610 is about +0.15 to −0.10 GPa whereas in the GaN/Si (111) platform 604, the stress is about 0.65±0.05 GPa. As this example embodiment relates to GaN mechanical structures on bulk Si(111) and since the thickness of bulk Si(111) is fixed, the thickness of the GaN layer and interlayer conditions are used to control the stress in the epilayer.

Figure 7:
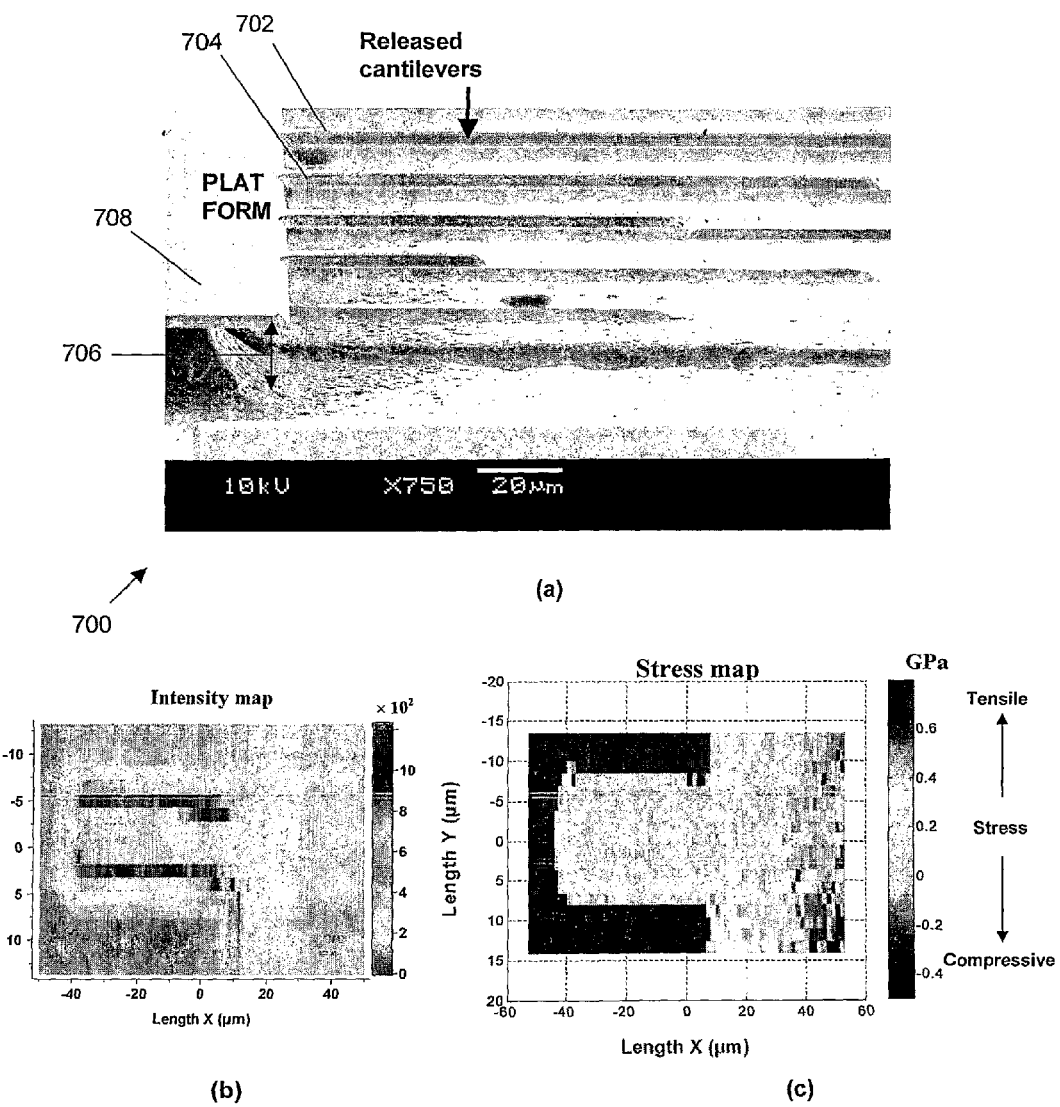
FIG. 7(a) is a SEM image showing freestanding GaN cantilever structures of the sample of FIG. 5(a).
FIG. 7(b) is an $E_2$ phonon peak intensity mapping diagram of the GaN cantilever structures of the sample of FIG. 5(a).
FIG. 7(c) is a Raman stress profile mapping diagram of the GaN cantilever structures of the sample of FIG. 5(a).

FIG. 7(a) is a SEM image 700 showing freestanding GaN cantilever structures e.g. 702, 704 of the sample 500 (FIG. 5(a)). The SEM image 700 shows an airgap 706 of about 23 μm thickness where a Si layer from the substrate 504 (FIG. 5(a)) has been etched with $XeF_2$. The array of cantilevers seen from the SEM image 700 shows a change in contrast in the optical microscopic images of the released structures e.g. 702, 704 and the platform 708. However, without an etch-stop layer (e.g. $SiO_2$), the entire Si material from the substrate 504 (FIG. 5(a)) would be etched without any masking step. Thus, one reason for preferring SOI wafers over bulk Si(111) substrates is that the thickness of Si overlayers and underlying $SiO_2$ layers can be precisely controlled on SOI wafers during substrate fabrication to control airgap dimensions. Residual stress can also be controlled using pre-defined SOI layer thickness.

FIG. 7(b) is an $E_2$ phonon peak intensity mapping diagram of the GaN cantilever structures e.g. 702, 704 of the sample 500 (FIG. 5(a)). FIG. 7(c) is a Raman stress profile mapping diagram of the GaN cantilever structures e.g. 702, 704 of the sample 500 (FIG. 5(a)). Raman measurements show that the GaN release by $XeF_2$ dry etching is approaching towards a stress-free phonon peak. The stress variation in the GaN released cantilever structures e.g. 702, 704 is about −0.05 to +0.20 GPa whereas in the GaN/Si (111) platform 708, the stress is about 0.60±0.05 GPa. As this example embodiment relates to GaN mechanical structures on bulk Si(111) and since the thickness of bulk Si(111) is fixed, the thickness of the GaN layer and interlayer conditions are used to control the stress in the epilayer. For the results, reference is made to Tripathy et al. "Micro-Raman probing of residual stress in freestanding GaN-based micromechanical structures fabricated by a dry release technique", J. Appl. Phys. 101, 063525 (2007).

In another example embodiment, using a conventional RF Magnetron system, ZnO material of about 500-600 nm thickness is sputtered directly onto SIMOX_SOI (111) wafers.

Figure 8:
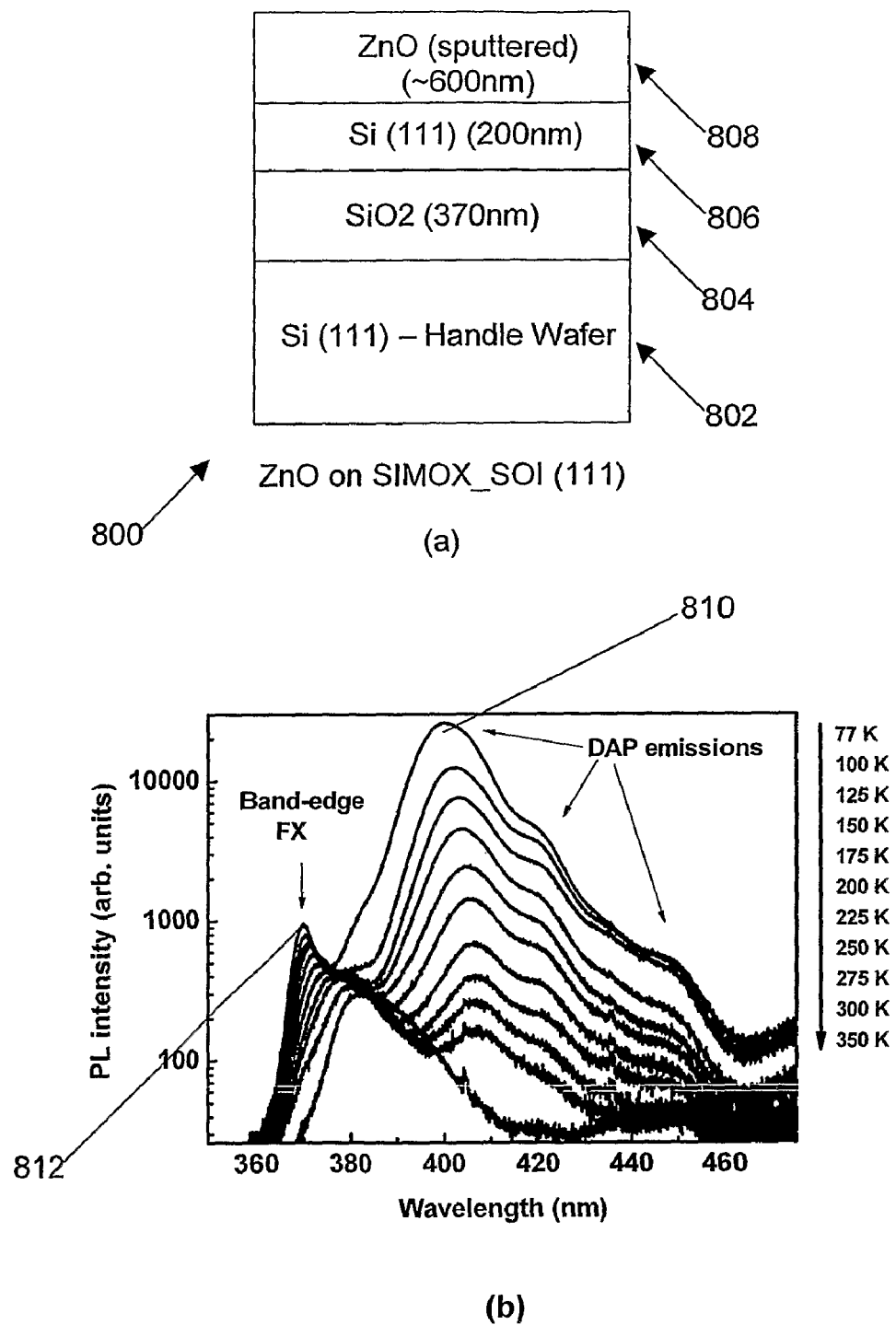
FIG. 8(a) is a schematic diagram illustrating a sample in another example embodiment.
FIG. 8(b) is a PL intensity vs wavelength graph showing temperature-dependent micro-PL measurements performed between 77K and 350K on the sample of FIG. 8(a).
FIG. 8(c) is a PL intensity vs wavelength graph showing room temperature PL spectrum measurements on the ZnO layer.
FIG. 8(d) is a cross-sectional SEM image of the sample of FIG. 8(a).
Figure 8:
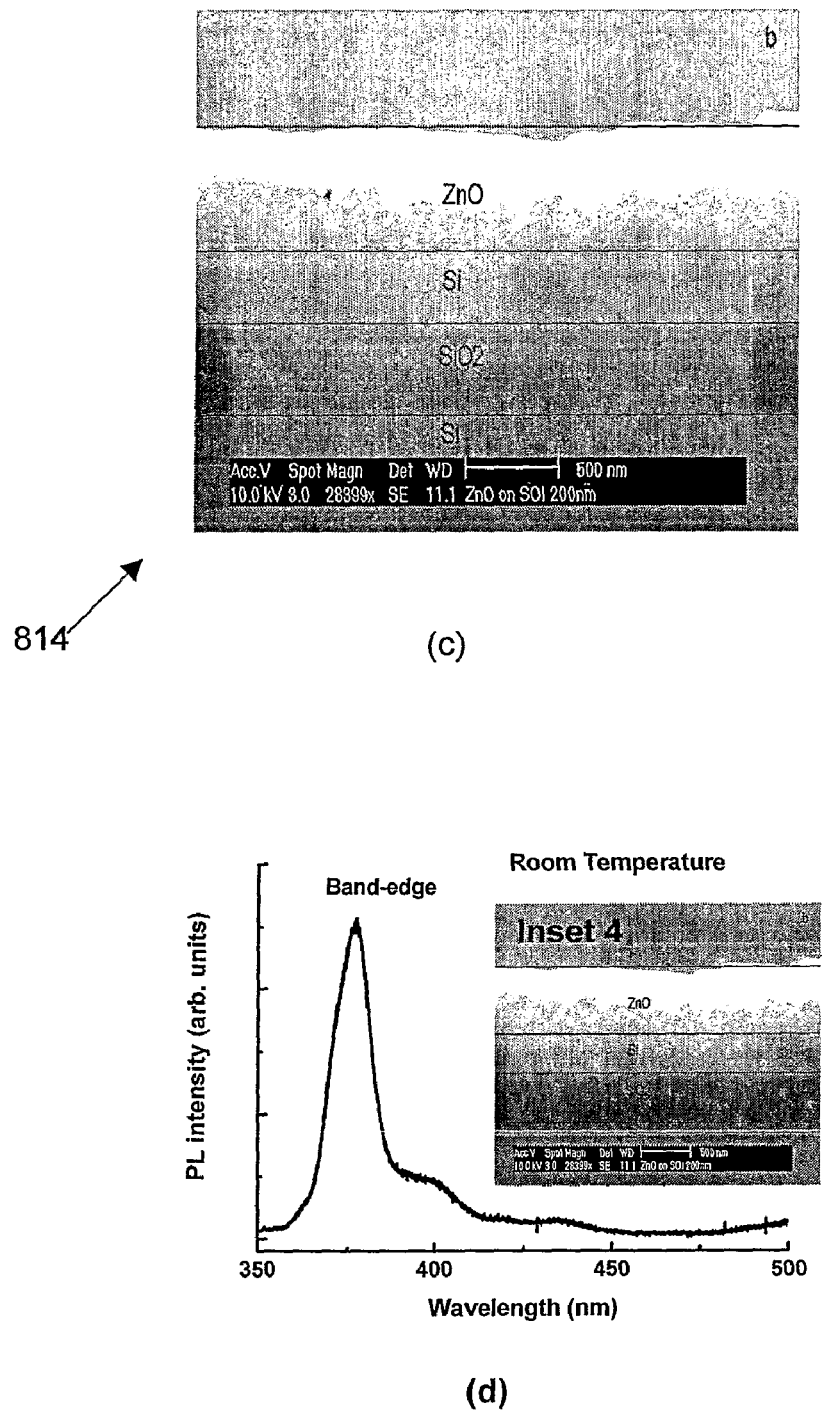

FIG. 8(a) is a schematic diagram illustrating a sample 800 in the example embodiment. The sample 800 comprises a SIMOX_SOI (111) substrate 802 that includes an "inherent" $SiO_2$ layer 804 of about 370 nm thickness and an "inherent" Si overlayer 806 of about 200 nm thickness. The sample 800 further comprises a ZnO layer 808 of about 600 nm sputtered on the SIMOX_SOI (111) substrate 802 (ie. on the Si overlayer 806), without depositing an additional or "dedicated" sacrificial layer.

Thus, it will be appreciated that the control of airgap thickness is advantageously separated from the device buildup processes and is provided by a control of the "inherent" Si overlayer thickness.

FIG. 8(b) is a PL intensity vs wavelength graph showing temperature-dependent micro-PL measurements performed between 77K and 350K on the ZnO layer 808 sputtered on the SIMOX_SOI substrate 802. From FIG. 8(b), a sharp donor-acceptor-pair (DAP) emission (see numeral 810) can be observed at the low-temperature (77K) PL spectrum. The DAP emission fades away when the temperature is increased to about 350K. Similarly, a narrow band-edge free excitonic emission (FX) (see numeral 812) can be observed at 77 K from the PL spectrum, which broadens with increasing sample temperature.

FIG. 8(c) is a PL intensity vs wavelength graph showing room temperature PL spectrum measurements on the ZnO layer 808 sputtered on the Si overlayer 806. FIG. 8(d) is a cross-sectional SEM image of the sample 800.

In the example embodiment, the ZnO layer 808 is patterned with features of varying bridges and cantilever lengths using standard photolithography and etched for a period of about 10 mins to a depth of about 620 nm using constant process parameters of about 20 sccm $BCl_3$ flow, 10 sccm $Cl_2$ flow, 500 W ICP power, 200 W RIE power, 5 mTorr pressure and 6° C. temperature. The sample 800 is subjected to $XeF_2$ etching of the Si overlayer 806 for two pulses of about 100 seconds each.

Figure 9:
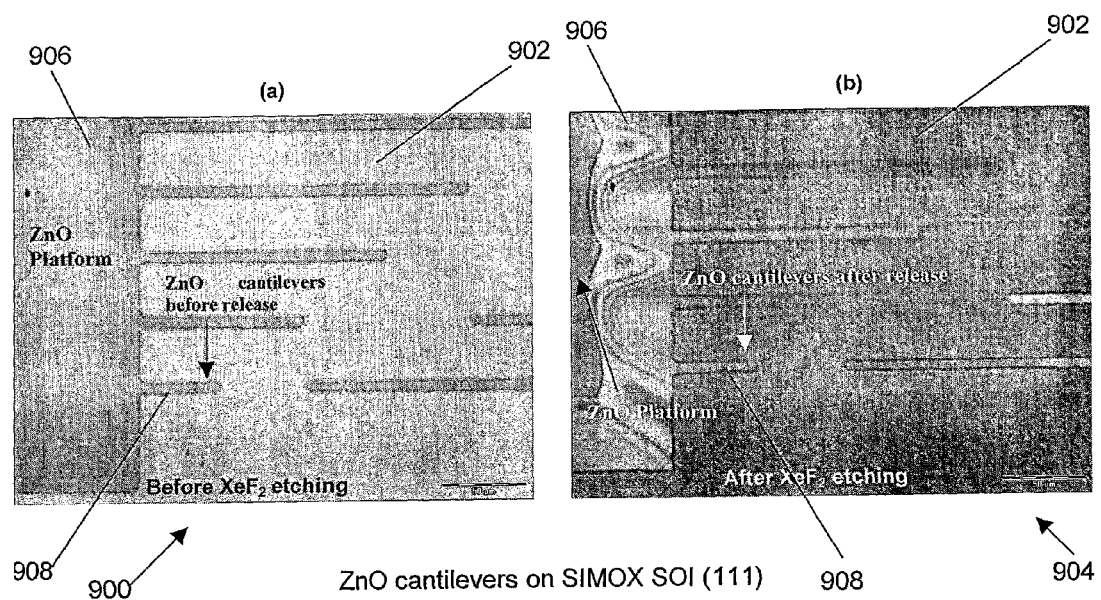
FIG. 9(a) is a microscope image of a cantilever structure of the sample of FIG. 8(a) before $XeF_2$ etching.
FIG. 9(b) is a microscope image of the cantilever structure of the sample of FIG. 8(a) after $XeF_2$ etching.

FIG. 9(a) is a microscope image 900 of a cantilever structure 902 of the sample 800 (FIG. 8(a)) before $XeF_2$ etching. FIG. 9(b) is a microscope image 904 of the cantilever structure 902 of the sample 800 (FIG. 8(a)) after $XeF_2$ etching. Comparing FIG. 9(b) to FIG. 9(a), the change in contrast in the ZnO platform 906 and cantilevers e.g. 908 indicates that the underlying Si overlayer 806 (FIG. 8(a)) has been completely etched.

Similar effects are observed for another example embodiment comprising a ZnO bridge and for yet another example embodiment comprising a 500 nm ZnO layer sputtered on a 100 nm Si overlayer.

Returning to FIGS. 9(a) and (b), the released ZnO structure 902 were further characterized using micro-Raman spectroscopy. The $E_2$ phonon of ZnO observed near 438 $cm^{-1}$ has been used to evaluate the residual stress. Since the ZnO structure is polycrystalline in nature, a residual stress of about 0.15 GPa was measured from phonon peak shift and using the relation, $\Delta\omega=K\sigma$, where K is the proportionality factor given by 6.7 $GPa^{-1}cm^{-1}$. The reduction in initial growth-induced residual stress in the ZnO structure films is due to the substrate compliance. Furthermore, it was observed that the released structure 902 may possess some tensile bending stress of the order of 100 MPa and this stress is more likely controlled by the cantilever/bridge dimensions. The bending stress has caused additional variation in the phonon peak positions. For the ZnO buildup processes, experiments were conducted using SOI substrates with Si overlayer thicknesses varying from about 100 nm to about 3.0 μm inherent to the substrates. The growth-induced residual stress was found to vary from sample to sample in the range of about 0.20 to about 0.45 GPa as the thickness of the Si overlayers varied. A vertical stress gradient along the growth direction was found to control the residual stress after device release by dry etching. The residual stress in ZnO released cantilevers and micro-bridges was found to vary from about −0.05 GPa to about 0.40 GPa on SOI platforms. The variation of residual stress is dependent on the geometrical dimensions of the mechanical structures, the growth-induced stress, and the thickness of the ZnO layers on SOI.

In another example embodiment, ZnO is sputtered on bonded SOI substrates. The substrates can be 2 or 4-in.-diameter commercial grade bonded SOI structures comprising a Si (111) device layer (about 3±0.5 μm thickness), a 2.0 to 2.5 μm thick buried $SiO_2$ layer, and a Si (111) handle substrate (about 400±25 μm thickness). The orientation of the SOI (111) layers are tilted by 0.5°±4° off axis. Using a conventional RF Magnetron system, ZnO material thickness of about 2.5 μm and about 1.0 μm respectively is sputtered directly onto the bonded SOI substrates.

Figure 10:
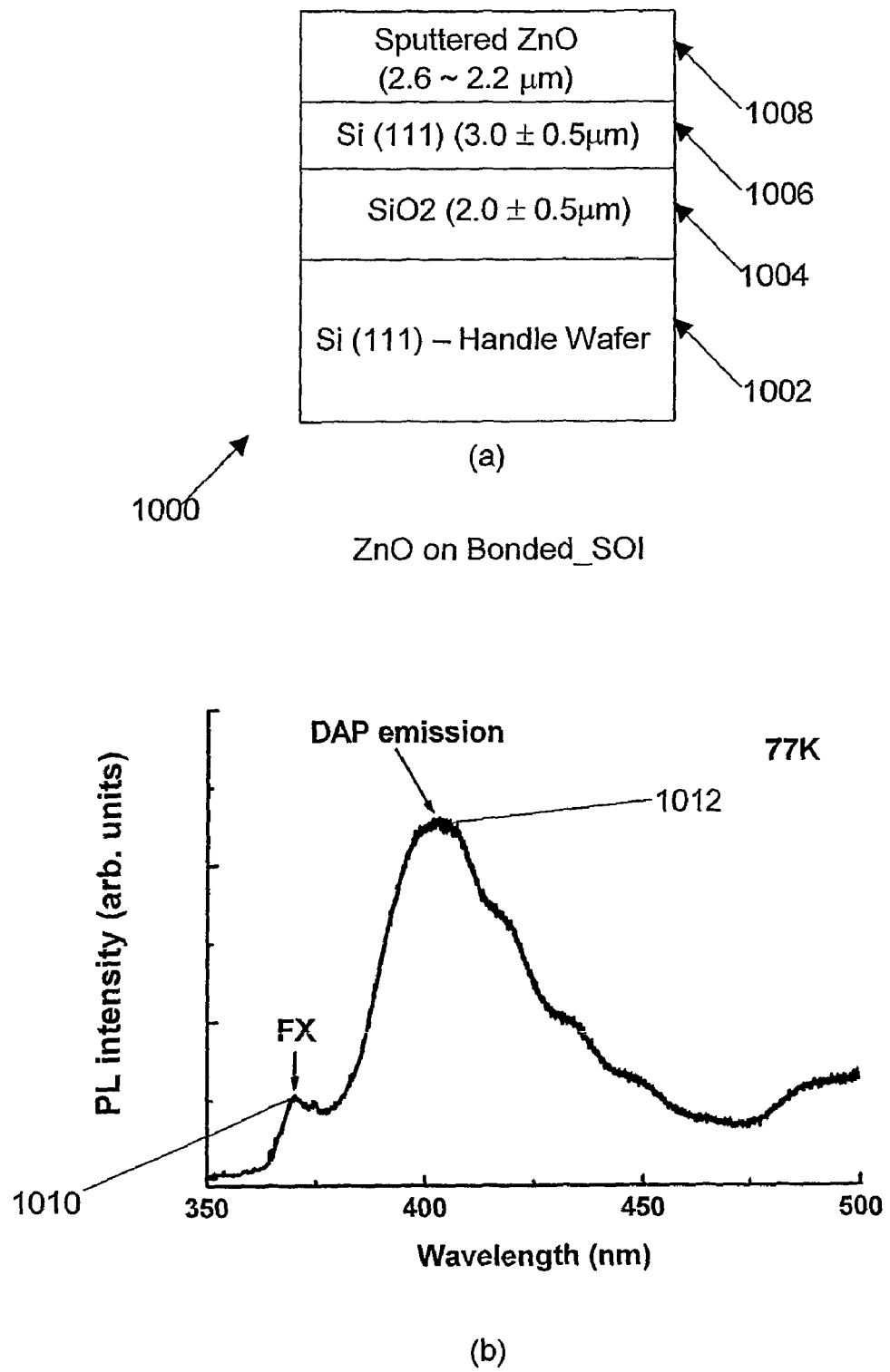
FIG. 10(a) is a schematic diagram illustrating a sample in an example embodiment.
FIG. 10(b) is a PL intensity vs wavelength graph showing PL spectra measured from the sample of FIG. 10(a).

FIG. 10(a) is a schematic diagram illustrating a sample 1000 in the example embodiment. The sample 1000 comprises a Si(111) bonded SOI substrate 1002 that includes an "inherent" $SiO_2$ layer 1004 of about 2.0 μm thickness and an "inherent" Si overlayer 1006 of about 3.0 μm thickness. The sample 1000 further comprises a ZnO layer 1008 of about 2.5

μm thickness sputtered on the Si overlayer 1006, without depositing an additional or "dedicated" sacrificial layer.

Thus, it will be appreciated that the control of airgap thickness is advantageously separated from the device buildup processes and is provided by a control of the "inherent" Si overlayer thickness.

A 77 K PL measurement is conducted using a micro-PL setup. FIG. 10(b) is a PL intensity vs wavelength graph showing the spectra measured from the ZnO layer 1008 sputtered on the Si overlayer 1006. From FIG. 10(b), the spectra show a near-band-edge free excitonic emission (FX) (see numeral 1010) and the presence of donor-bound excitonic peaks at low-temperature (DX). The donor-acceptor pair emissions (DAP) are much stronger at 77 K (see numeral 1012).

In the example embodiment, the ZnO layer 1008 is patterned with features of varying bridges and cantilever lengths using standard photolithography and etched for a period of about 20 mins to a depth of about 3.0 μm using constant process parameters of about 20 sccm $BCl_3$ flow, 10 sccm $Cl_2$ flow, 500 W ICP power, 200 W RIE power, 5 mTorr pressure and 6° C. temperature. The sample 1000 is subjected to $XeF_2$ etching of Si layer 1006 for a single pulse of about 30 seconds.

Figure 11:
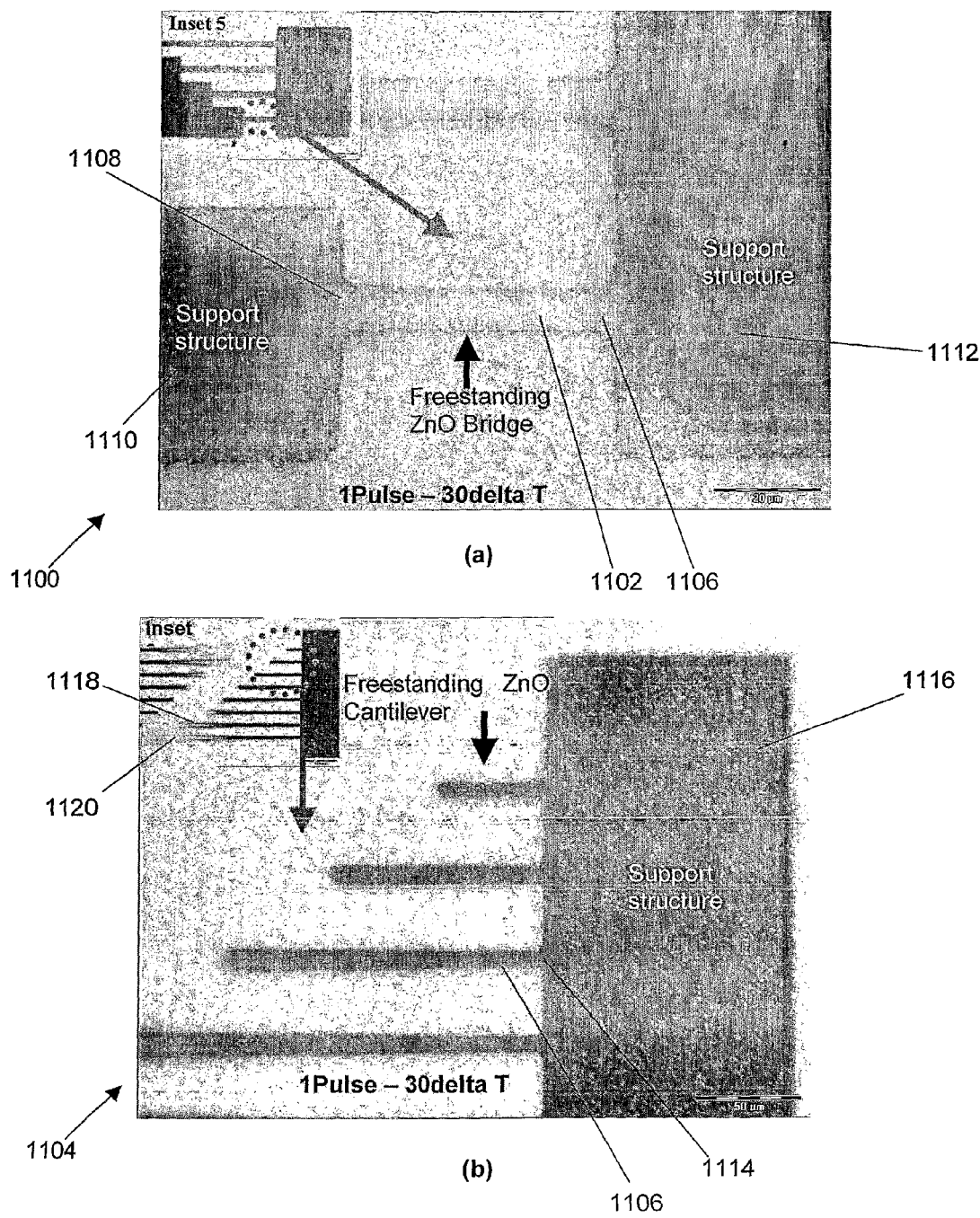
FIG. 11(a) is a microscope image showing a ZnO bridge structure of the sample of FIG. 10(a) after $XeF_2$ etching.
FIG. 11(b) is a microscope image showing cantilever structures of the sample of FIG. 10(a) after $XeF_2$ etching.

FIG. 11(a) is a microscope image 1100 showing a ZnO bridge structure 1102 of the sample 1000 (FIG. 10(a)) after. $XeF_2$ etching. FIG. 11(b) is a microscope image 1104 showing cantilever structures e.g. 1106 of the sample 1000 (FIG. 10(a)) after $XeF_2$ etching. In FIG. 11(a), the ZnO bridge structure 1102 is observed to be free-standing on the bonded SOI wafer with the structure 1102 held on two ends 1106, 1108. It can be observed that the contrast of the bridge structure 1102 is much lighter as compared to support structures 1110, 1112. The microscope image of the entire bridge structure is shown in Inset 5. In FIG. 11(b), the ZnO cantilever structures e.g. 1106 are observed to be free-standing on the bonded SOI wafer with the cantilever structures e.g. 1106 held at an end e.g. 1114. It can be observed that the contrast of the cantilever structures e.g. 1106 is much lighter as compared to a support structure 1116. The microscope image of the entire cantilever structure is shown in Inset 6. It can be observed that some of the longer cantilevers e.g. 1118,1120 are curling upwards due to in-built stress of the ZnO material.

Figure 12:
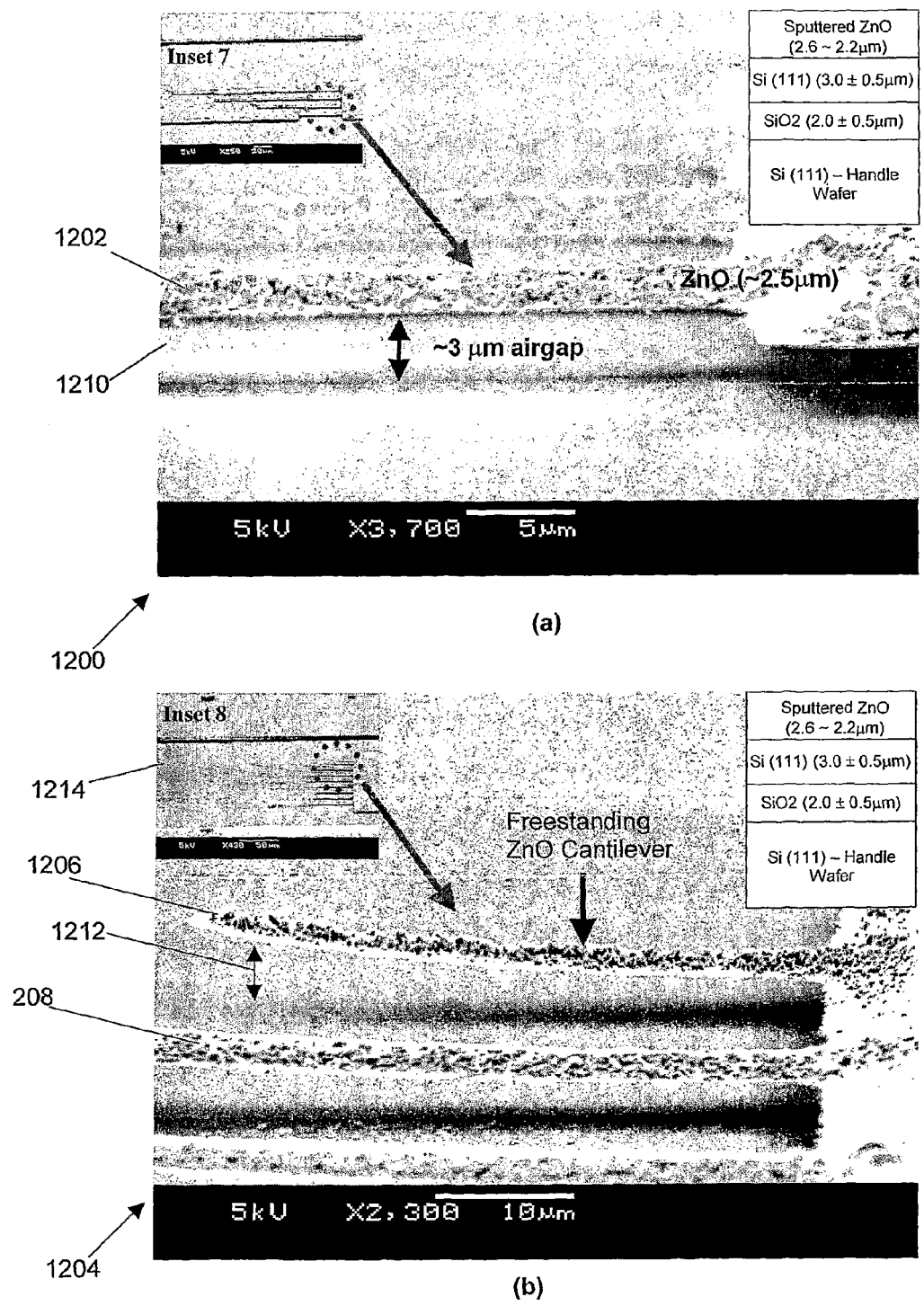
FIG. 12(a) is a SEM image of a released ZnO bridge structure of the sample of FIG. 10(a).
FIG. 12(b) is a SEM image of cantilever structures of the sample of FIG. 10(a).

FIG. 12(a) is a SEM image 1200 of a released ZnO bridge structure 1202 of the sample 1000 (FIG. 10(a)). FIG. 12(b) is a SEM image 1204 of cantilever structures e.g. 1206, 1208 of the sample 1000 (FIG. 10(a)). In FIG. 12(a), the ZnO bridge structure 1202 is shown to be about 2.5 μm thick with an airgap 1210 of about 3 μm. The SEM image of the entire bridge structure is shown in Inset 7. In FIG. 12(b), the cantilever structures e.g. 1206, 1208 are shown to be about 2.5 μm thick with an airgap 1212. Due to in-built stress of the ZnO material, the cantilever structures e.g. 1206, 1208 are curling upwards. The SEM image of the entire cantilever structure is shown in Inset 8, which also shows the cantilever structures curling upwards (see e.g. 1214).

Figure 13:
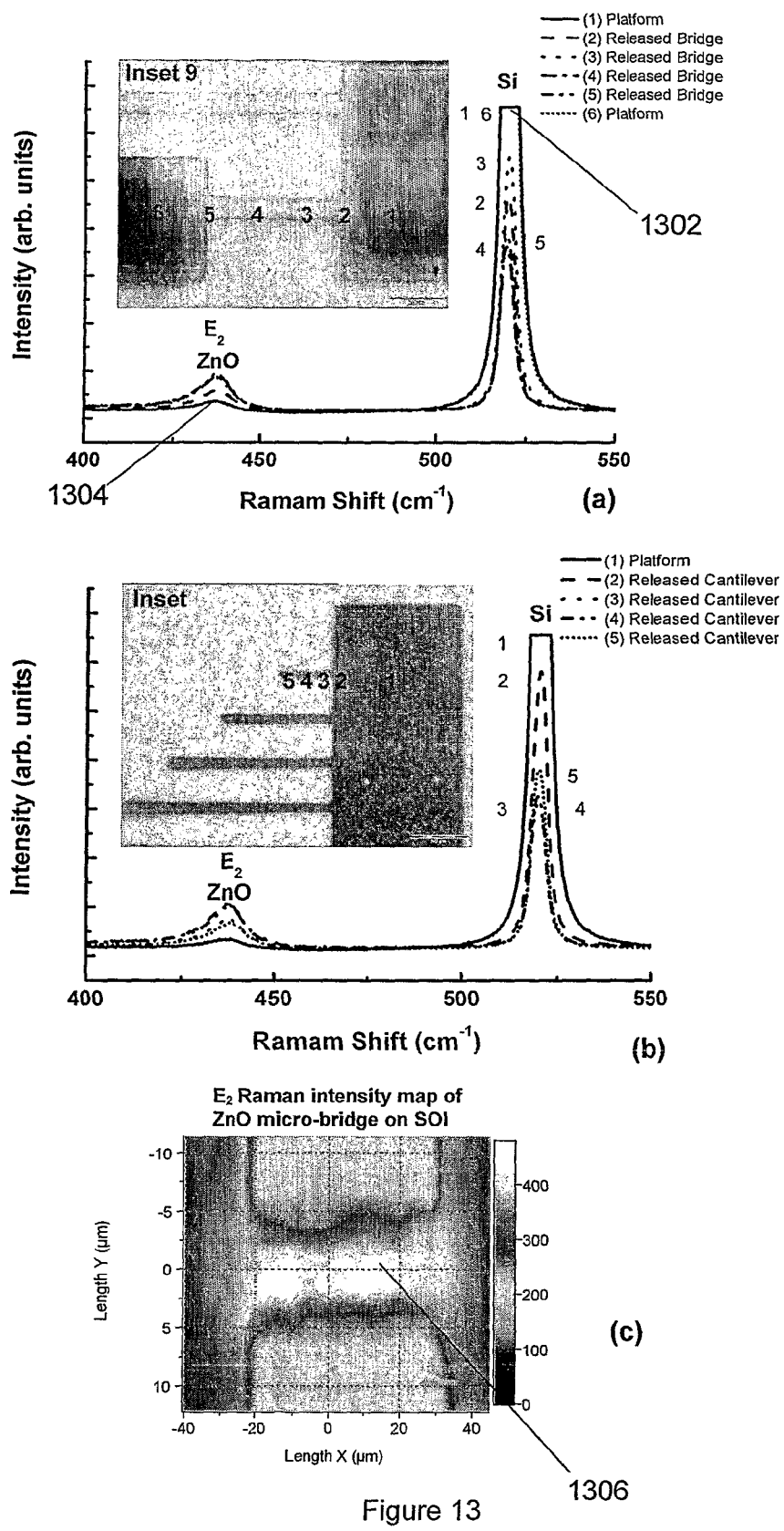
FIG. 13(a) is an intensity vs Raman shift graph showing measured micro-Raman spectra of the bridge structure of FIG. 11(a).
FIG. 13(b) is an intensity vs Raman shift graph showing measured micro-Raman spectra of the cantilever structures of FIG. 11(b).
FIG. 13(c) is a Raman mapping diagram of $E_2$ phonon intensity in the ZnO micro-bridge structure of FIG. 11(a).

In the example embodiment, the released ZnO microbridge structure 1102 (FIG. 11(a)) and the cantilever structures e.g. 1106 (FIG. 11(b)) are further characterized by the spatially resolved micro-Raman technique. FIG. 13(a) is a intensity vs Raman shift graph showing the measured micro-Raman spectra of the bridge structure 1102 (FIG. 11(a)). FIG. 13(b) is a intensity vs Raman shift graph showing the measured micro-Raman spectra of the cantilever structures e.g. 1106 (FIG. 11(b)). From FIG. 13(a), it can be observed that the two support structures or platforms 1110 and 1112 have a strong Si intensity at 520 $cm^{-1}$ (see e.g. numeral 1302) while the $E_2$ phonon intensity of ZnO is the weakest at 437 $cm^{-1}$ (see e.g. numeral 1304). Due to the presence of the residual bending stress in the released polycrystalline structures e.g. 1102, a slight variation of the $E_2$ phonon peak positions can be observed. A similar effect can be observed from FIG. 13(b) for the cantilever structures e.g. 1106 (FIG. 11(b)). Stress-sensitive $E_2$ phonon peak shifts can be used to estimate the stress profiles using the relationship, $\Delta\omega=K\sigma$, where K is the proportionality factor given by 6.7 $GPa^{-1}cm^{-1}$. This relationship has been derived using the Raman data and appropriate phonon deformation potentials. The elastic stiffness constants of ZnO were used to determine the proportionality factor. For the calculations, reference is made to Vicknesh et al. "Surface micromachined freestanding ZnO microbridge and cantilever structures on Si(111) substrates", Appl. Phys. Lett. 90, 091913 (2007).

FIG. 13(c) is a Raman mapping diagram of $E_2$ phonon intensity in the ZnO micro-bridge structure 1102 (FIG. 11(a)). The central portion 1306 shows maximum Raman intensity due to selective removal of the silicon overlayer 1006 (FIG. 10(a)). The residual stress in the polycrystalline ZnO varies in the range of about 0.22 to 0.11 GPa in the support structures or platforms 1110, 1112 (FIG. 11(a)) and the as-grown films. The 'as-grown films' refer to the polycrystalline ZnO. It was found that the stress in platform regions can be the same as the as-grown films. The dry released freestanding regions were found to have different stress values. Raman measurements show that the tensile bending stress varies in the range of about 0.15 to −0.05 GPa in the freestanding cantilevers 1106 (FIG. 11(b)). Geometrical effects and growth-induced mechanical properties may have caused such a variation of the gradient residual stress in the freestanding cantilevers 1106 (FIG. 11(b)). For the ZnO buildup processes, experiments were conducted using SOI substrates with Si overlayer thicknesses varying from about 100 nm to about 3.0 μm inherent to the substrates. The growth-induced residual stress was found to vary from sample to sample in the range of about 0.20 to about 0.45 GPa as the thickness of the Si overlayers varied. A vertical stress gradient along the growth direction was found to control the residual stress after device release by dry etching. The residual stress in ZnO released cantilevers and micro-bridges was found to vary from about −0.05 GPa to about 0.40 GPa on SOI platforms. The variation of residual stress is dependent on the geometrical dimensions of the mechanical structures, the growth-induced stress, and the thickness of the ZnO layers on SOI.

In another example embodiment, ZnO is provided on bulk Si(111) substrates. In the example embodiment, SEM images of bridge and cantilever structures before and after subjecting to $XeF_2$ dry release/etching confirm the undercut etching. In optical microscopy images (not shown), the change in the contrast with respect to the ZnO platform and bridge indicates that the underlying Si material of the substrates has been etched.

Figure 14:
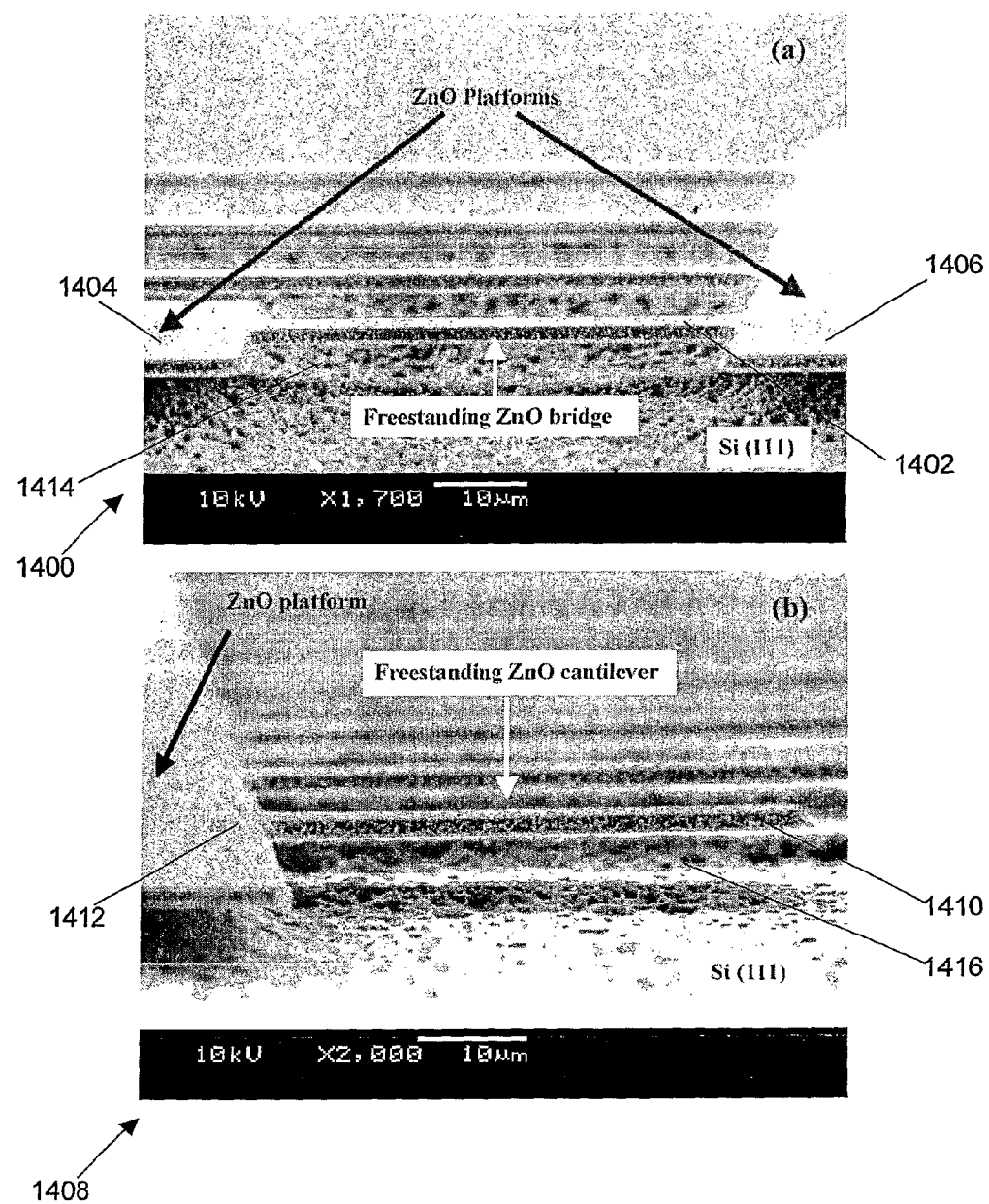
FIG. 14(a) is a SEM image of a released ZnO bridge structure on bulk Si(111) platforms in another example embodiment.
FIG. 14(b) is a SEM image of cantilever structures on a bulk Si(111) platform in the example embodiment.

FIG. 14(a) is a SEM image 1400 of a released ZnO bridge structure 1402 on bulk Si(111) platforms 1404, 1406. FIG. 14(b) is a SEM image 1408 of cantilever structures e.g. 1410 on a bulk Si(111) platform 1412. The dimension of airgaps 1414, 1416 are about 4.3 μm each and the under cut etching is clearly visible for the bridge structure 1402 and the cantilever structures e.g. 1410. From the Raman analysis, it is found that, in the example embodiment, the as-grown ZnO film (about 1.7 μm thick) on the bulk Si(111) shows a residual tensile stress of about 0.55±0.03 GPa. From the platform areas 1404, 1406, 1412 of the patterned structures, the stress values remain substantially the same and are of the order of about 0.52 to 0.55 GPa. From FIG. 14(a), along the 50 μm long freestanding micro-bridge structure 1402, a variation of the residual stress in the range of about 0.33±0.03 to about 0.42±0.03 GPa can be estimated from the Raman line scan. From FIG. 14(b), along the 50 μm long cantilever structures e.g. 1410, a variation of the residual stress in the range of about 0.29±0.03 to about 0.40±0.03 GPa can be estimated from the Raman line scan. For the cantilever structures e.g. 1410, with an increased beam length of up to about 400 μm, a slightly higher value of tensile stress (ie. up to about 0.43±0.03 GPa) can be observed at the edges of the cantilever structures e.g. 1410.

In yet another example embodiment, nanocrystalline and microcrystalline diamond mechanical structures are provided on silicon. The nanocrystalline diamond (NCD) microstructures are patterned by ICP etching prior to $XeF_2$ etching. For the ICP etching, Al hard masks are used for dry etching of diamond with $Ar/O_2$ plasma.

Figure 15:
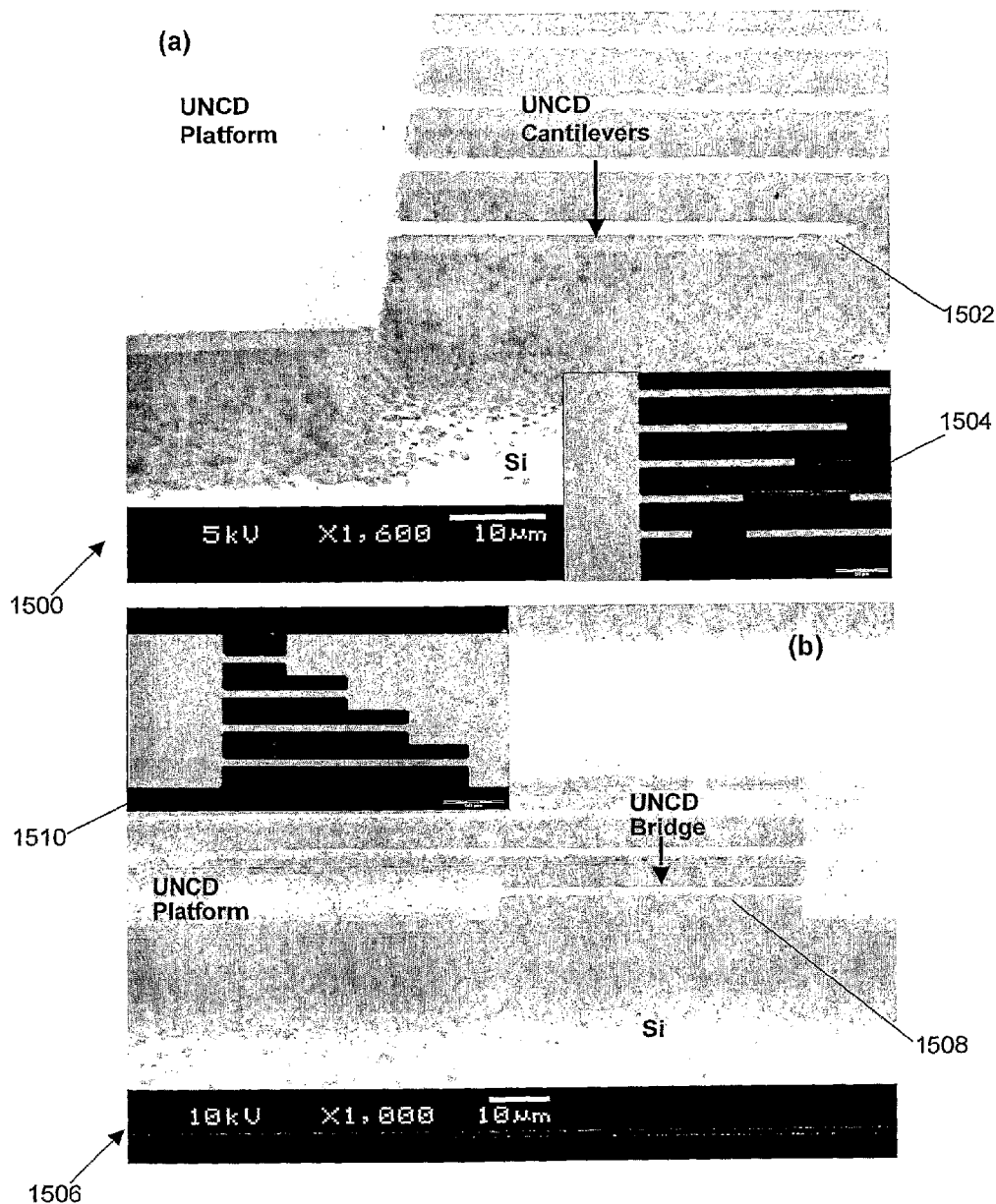
FIG. 15(a) is a SEM image of freestanding nanocrystalline diamond (NCD) cantilever structures in an example embodiment.
FIG. 15(b) is a SEM image of a freestanding NCD bridge structure in the example embodiment.

FIG. 15(a) is a SEM image 1500 of freestanding NCD cantilever structures e.g. 1502 in the example embodiment. The NCD cantilever structures e.g. 1502 have been subjected to about 2 mins of $XeF_2$ etching. A change in the contrast within the area of the cantilever structures e.g. 1502 can be observed in the microscope image 1504 shown in the inset. The change in the contrast can also be observed in the SEM image 1500.

FIG. 15(b) is a SEM image 1506 of a freestanding NCD bridge structure 1508 in the example embodiment. The NCD bridge structure 1508 has been subjected to about 2 mins of $XeF_2$ etching. A change in the contrast within the area of the bridge structure 1508 can be observed in the microscope image 1510 shown in the inset. The change in the contrast can also be observed in the SEM image 1506.

In the example embodiment, the diamond micromechanical structures 1502, 1508 are mechanically stable.

Figure 16:
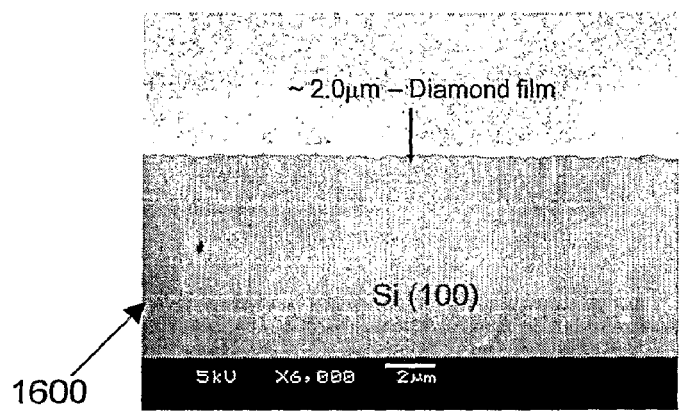
FIG. 16(a) is a cross section SEM image showing chemical vapour deposition (CVD)-grown microcrystalline diamond mechanical structures in another example embodiment.
FIG. 16(b) is a SEM image showing polycrystalline/microcrystalline diamond cantilevers in the example embodiment.
FIG. 16(c) is a SEM image showing polycrystalline/microcrystalline micro-bridge structures in the example embodiment.
Figure 16:
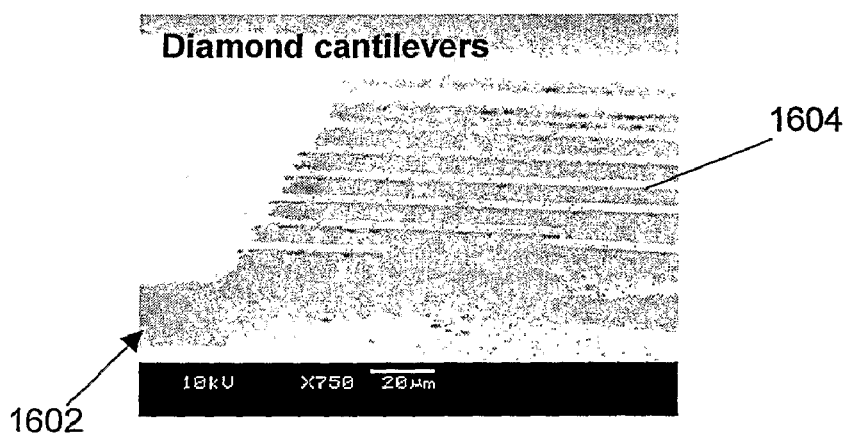
Figure 16:
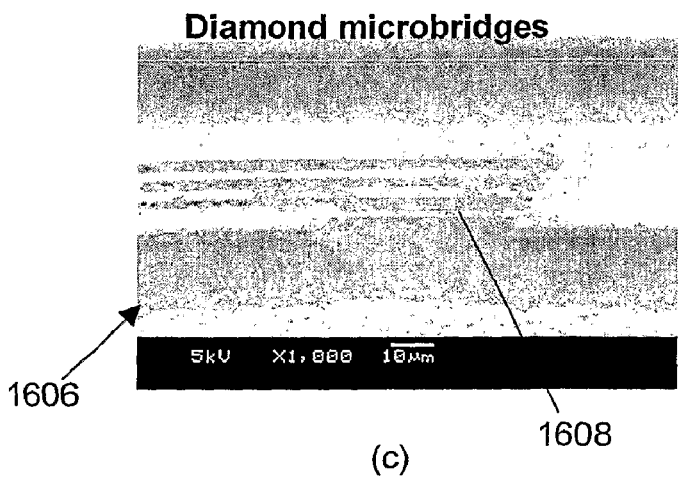

In another example embodiment, similar fabrication steps are employed to realize chemical vapour deposition (CVD)-grown microcrystalline diamond mechanical structures. FIG. 16(a) is a cross section SEM image 1600 showing the CVD-grown microcrystalline diamond mechanical structures in the example embodiment. FIG. 16(b) is a SEM image 1602 showing polycrystalline/microcrystalline diamond cantilevers e.g. 1604 in the example embodiment. FIG. 16(c) is a SEM image 1606 showing polycrystalline/microcrystalline micro-bridge structures e.g. 1608 in the example embodiment.

In another example embodiment, GaN-based light emitting diode (LED) and field effect transistor (FET) micromechanical structures are provided. To fabricate photonic and mechanical sensors, freestanding LEDs and field effect transistors are fabricated on silicon and SOI platforms.

Figure 17:
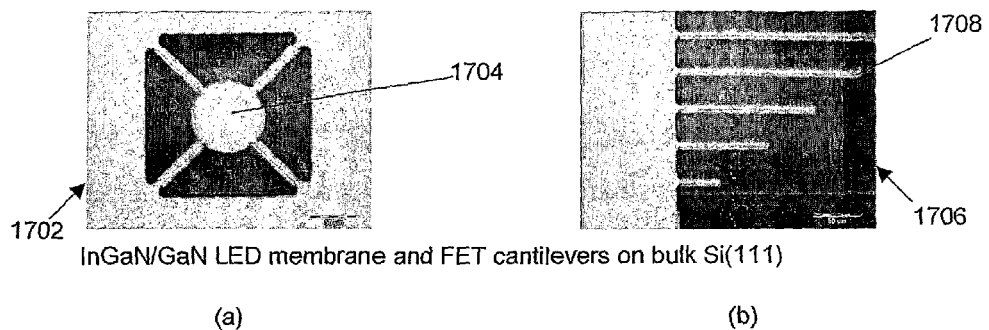
FIG. 17(a) is an optical microscope image showing a light emitting diode (LED) microstructure on a bulk silicon platform in another example embodiment.
FIG. 17(b) is an optical microscope image showing field effect transistor (FET) cantilevers on a bulk silicon platform in the example embodiment.
FIG. 17(c) is an optical microscope image showing a LED microstructure on a SOI platform in the example embodiment.
FIG. 17(d) is an optical microscope image showing FET cantilevers on a SOI platform in the example embodiment.
Figure 17:
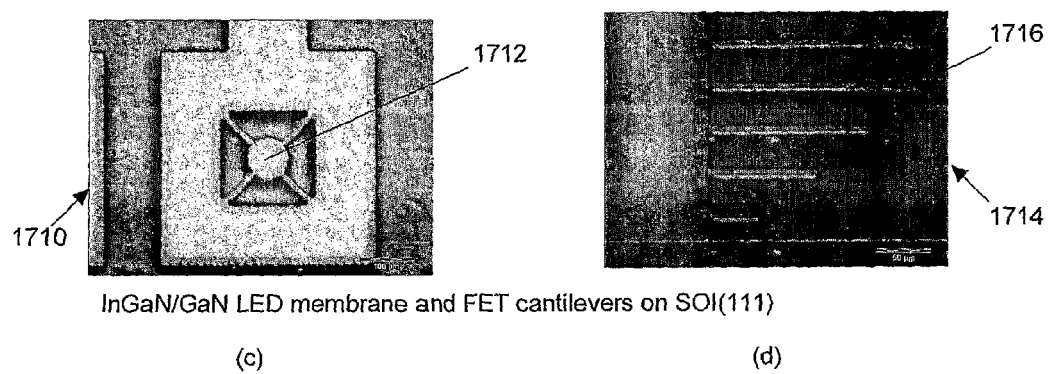

FIG. 17(a) is an optical microscope image 1702 showing a LED microstructure membrane 1704 on a bulk silicon platform in the example embodiment. FIG. 17(b) is an optical microscope image 1706 showing FET cantilevers e.g. 1708 on a bulk silicon platform in the example embodiment. FIG. 17(c) is an optical microscope image 1710 showing a LED microstructure membrane 1712 on a SOI platform in the example embodiment. FIG. 17(d) is an optical microscope image 1714 showing FET cantilevers e.g. 1716 on a SOI platform in the example embodiment.

In the example embodiment, the underetched structures are created by the $XeF_2$ dry release technique. Such mechanical structures are suitable for photonic sensing. Apart from using InGaN/GaN, AlGaN/GaN FET cantilevers can be fabricated on both bulk silicon and SOI platforms. The undercut etching of the mechanical structures is highly selective and the final device release is achieved by $XeF_2$ dry etching of silicon and SOI.

Figure 18:
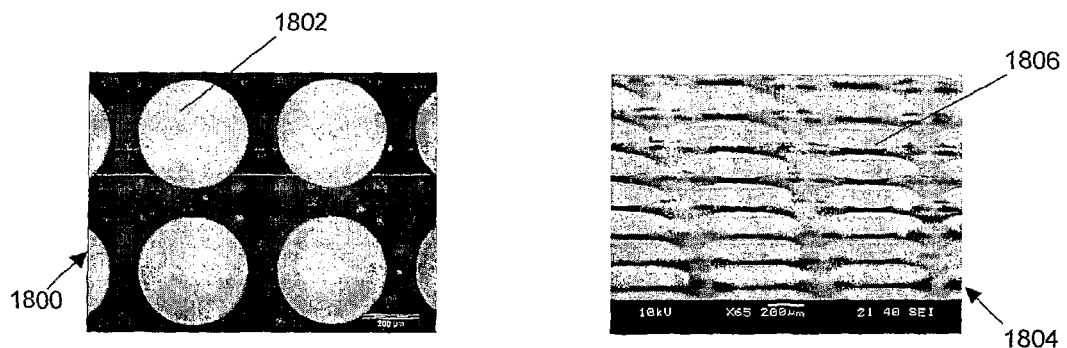
FIG. 18(a) is an optical microscopic image of microdisk LED structures in yet another example embodiment.
FIG. 18(b) is a SEM image of the microdisk LED structures in the example embodiment.
FIG. 18(c) is an electroluminescence (EL) intensity vs wavelength graph showing an EL spectrum measured from the microdisk LED structures in the example embodiment.
Figure 18:
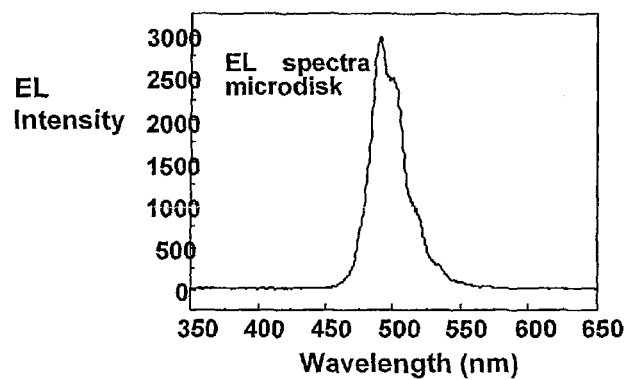

In yet another example embodiment, GaN-based undercut microdisk LED structures are provided. FIG. 18(a) is an optical microscopic image 1800 of microdisk LED structures e.g. 1802 in the example embodiment. FIG. 18(b) is a SEM image 1804 of the microdisk LED structures e.g. 1806 in the example embodiment. FIG. 18(c) is an electroluminescence (EL) intensity vs wavelength graph showing an EL spectrum measured from the microdisk LED structures e.g. 1806.

In the example embodiment, the vertical microdisk LED structures are processed with top p-bond pad and p-contact metallization. The representative electro-luminescence (EL) spectrum from such microdisk LED devices is shown in FIG. 18(c). It can be observed that undercut LEDs with InGaN/GaN multi-quantum wells can lead to an increase in blue and green EL intensity when compared to microstructured LEDs without $XeF_2$ etching of underlying Si. The substantial improvement in the visible light extraction efficiency due to selective removal of Si by $XeF_2$ etching shows potential applications of such microdisk LEDs for general illumination. In such under-etched structures, due to the increase in the junction temperature at the edges, wavelength stability can be maintained at higher driving currents for white light applications. The fabrication process of such LEDs can also be useful for micro-optomechanical systems and resonators.

Figure 19:
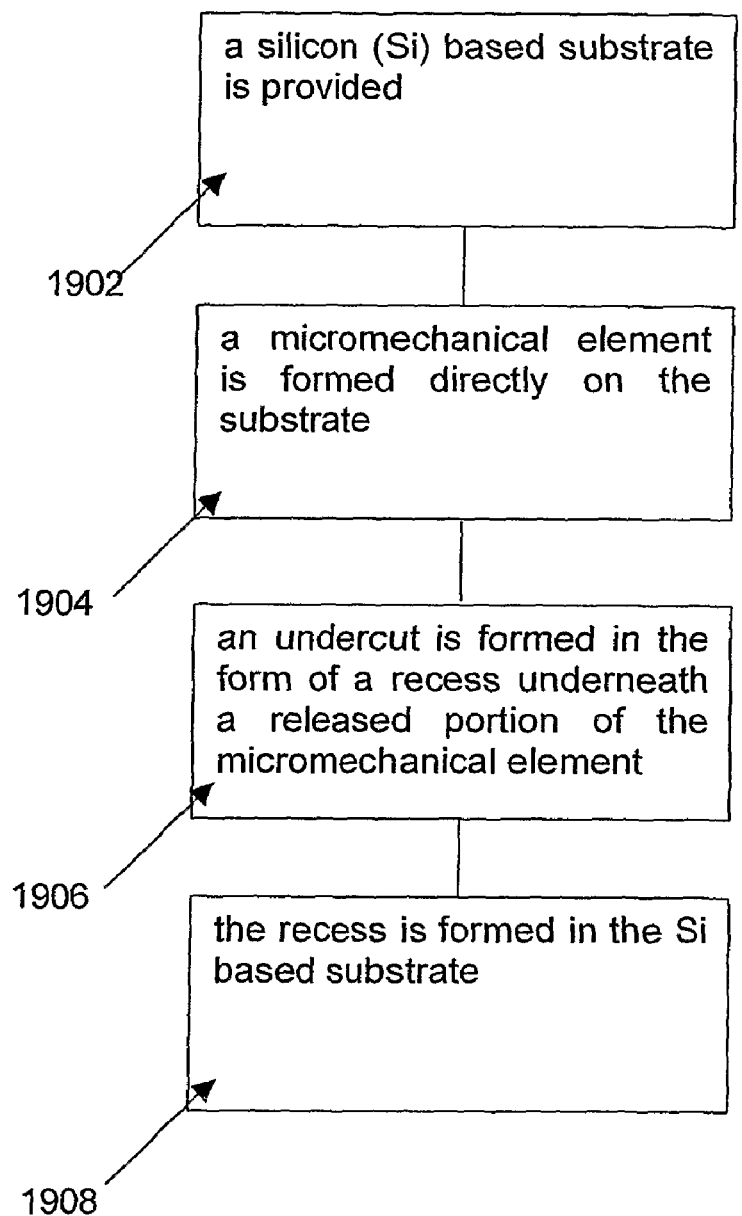
FIG. 19 is a schematic flowchart illustrating a method of fabricating a micromechanical structure.

FIG. 19 is a schematic flowchart 1900 illustrating a method of fabricating a micromechanical structure. At step 1902, a silicon (Si) based substrate is provided. At step 1904, a micromechanical element is formed directly on the substrate. At step 1906, an undercut is formed in the form of a recess underneath a released portion of the micromechanical element. At step 1908; the recess is formed in the Si based substrate.

In the above example embodiments, a II-VI wide bandgap semiconductor micromechanical structure or a III-V wide bandgap semiconductor micromechanical structure can be realized on SOI substrates. The SOI substrates can be prepared by wafer bonding and/or separation by implantation of oxygen (SIMOX). The SOI platforms may be of both (100) and (111) orientations. The SOI substrates of different orientations can result in a specific stress which can be tailored by precisely controlling the thickness of silicon over layers. The types of II-VI wide bandgap structures may include ZnO, Zn(Mg)O, Zn(Cd)O, ZnS related materials of single and heterostructure configurations with varying thickness. The types of III-V wide bandgap structures may include GaN, AlN, AlGaN, InGaN, and InN related materials of single and heterostructure configurations with varying thickness. The example embodiments are also applicable for polycrystalline and nanocrystalline diamond micromechanical structures on bulk Si and SOI substrates. The types of II-VI and III-V wide bandgap layers used to realize overhanging structures can provide controlled residual stress after sacrificial etching of silicon. The silicon of the substrates for dry etching are exposed via standard lithography techniques. The example embodiments can also provide wide bandgap semiconductor micromechanical structures such as an optoelectronic device comprising material such as e.g. InGaN/GaN-, AlGaN/GaN-, ZnMgO/ZnO-based light emitting diodes (LEDs) on bulk Si and SOI platforms. The example embodiments can also provide wide bandgap semiconductor micromechanical structures such as a microelectronic device comprising material such as e.g. AlGaN/GaN-, InAlN/GaN, ZnO/GaN-based hybrid field effect transistors (FETs) and high electron mobility transistors (HEMTs).

In the described example embodiments, the sacrificial release of Si and SOI is after the deposition of e.g. the wideband gap structures using various growth techniques. There is a growth-induced stress in such lattice and thermal mismatched materials grown on top of SOI and bulk Si. After device release, a bending stress component appears and is dependent on the layer thickness and geometrical dimensions. Such stress can also be significantly influenced by pre-designed growth-induced stress. Thus, by controlling these parameters, mechanical structures with predicted stress values may be designed using sacrificial dry release.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A micromechanical structure comprising:
   a silicon-on-insulator (SOI) substrate;
   a micromechanical element comprising wide bandgap material formed directly on the substrate; and
   an undercut formed underneath a released portion of the micromechanical element; the undercut being in the form of a recess formed in an inherent Si overlayer of the SOI substrate;
   wherein a thickness of the Si overlayer of the SOI substrate is chosen for controlling growth-induced stress in the micromechanical element, for in turn controlling a stress in the released portion of the micromechanical element; and wherein the wide band gap material comprises one or more materials selected from a group consisting of ZnO, Zn(Mg)O, Zn(Cd)O, ZnS, GaN, AlN, AlGaN, InGaN, InN, polycrystalline diamond and nanocrystalline diamond.

2. The structure as claimed in claim 1, wherein the recess extends through substantially the thickness of the Si overlayer of the SOI substrate.

3. The structure as claimed in claim 1, wherein the thickness is in a range of about 10 nm to about 4 μm.

4. The structure as claimed in claim 1, wherein a crystalline orientation of the SOI substrate is chosen for controlling the growth-induced stress in the micromechanical element, for in turn controlling the stress in the released portion of the micromechanical element.

5. The structure as claimed in claim 4, wherein the crystalline orientation is (111).

6. The structure as claimed in claim 1, wherein the micromechanical element comprises a light emitting diode (LED) structure, and the undercut in the form of a recess formed in the Si overlayer of the SOI substrate is formed using a XeF$_2$ dry etch process.

7. The structure as claimed in claim 1, wherein the micromechanical element comprises one or more Field-effect transistor (FET) structures, and the undercut in the form of a recess formed in the Si overlayer of the SOI substrate is formed using a XeF$_2$ dry etch process.

8. A method of fabricating a micromechanical structure, the method comprising the steps of:
   providing a silicon-on-insulator (SOI) substrate;
   forming a micromechanical element comprising wide bandgap material directly on the substrate;
   forming an undercut in the form of a recess underneath a released portion of the micromechanical element; the recess being formed in an inherent Si overlayer of the SOI substrate;
   wherein a thickness of the Si overlayer of the SOI substrate is chosen for controlling growth-induced stress in the micromechanical element, for in turn controlling a stress in the released portion of the micromechanical element; and wherein the wide band gap material comprises one or more materials selected from a group consisting of ZnO, Zn(Mg)O, Zn(Cd)O, ZnS, GaN, AlN, AlGaN, InGaN, InN, polycrystalline diamond and nanocrystalline diamond.

9. The method as claimed in claim 8, wherein the recess extends through substantially the thickness of the Si overlayer of the SOI substrate.

10. The method as claimed in claim 8, wherein the thickness is in a range of about 10 nm to about 4 μm.

11. The method as claimed in claim 8, further comprising choosing a crystalline orientation of the SOI substrate for controlling the growth-induced stress in the micromechanical element, for in turn controlling the stress in the released portion of the micromechanical element.

12. The method as claimed in claim 11, wherein the crystalline orientation is (111).

13. The method as claimed in claim 8, wherein the micromechanical element is formed directly on the substrate using metalorganic chemical vapour deposition (MOCVD).

14. The method as claimed in claim 8, wherein the micromechanical element comprises a light emitting diode (LED) structure, and the undercut in the form of a recess formed in the Si overlayer of the SOI substrate is formed using a XeF$_2$ dry etch process.

15. The method as claimed in claim 8, wherein the micromechanical element comprises one or more Field-effect transistor (FET) structures, and the undercut in the form of a recess formed in the Si overlayer of the SOI substrate is formed using a XeF$_2$ dry etch process.

* * * * *